(12) United States Patent
Miyoshi

(10) Patent No.: US 11,793,078 B2
(45) Date of Patent: Oct. 17, 2023

(54) PIEZOELECTRIC FILM, LAMINATED PIEZOELECTRIC ELEMENT, AND ELECTROACOUSTIC TRANSDUCER

(71) Applicant: FUJIFILM Corporation, Tokyo (JP)

(72) Inventor: Tetsu Miyoshi, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 225 days.

(21) Appl. No.: 17/486,445

(22) Filed: Sep. 27, 2021

(65) Prior Publication Data

US 2022/0013710 A1  Jan. 13, 2022

Related U.S. Application Data

(63) Continuation of application No. PCT/JP2020/014097, filed on Mar. 27, 2020.

(30) Foreign Application Priority Data

Mar. 28, 2019 (JP) .................... 2019-062632
Aug. 23, 2019 (JP) .................... 2019-152708

(51) Int. Cl.
*H04R 17/00* (2006.01)
*H10N 30/00* (2023.01)
(Continued)

(52) U.S. Cl.
CPC ....... *H10N 30/1051* (2023.02); *H04R 17/005* (2013.01); *H10N 30/852* (2023.02); *H10N 30/883* (2023.02)

(58) Field of Classification Search
CPC ..... H04R 17/00; H04R 17/005; H04R 17/025
(Continued)

(56) References Cited

U.S. PATENT DOCUMENTS 6,376,971 B1 * 4/2002 Pelrine .............. H04R 5/02
977/788
2014/0210309 A1 * 7/2014 Miyoshi ........... H04R 17/005
310/313 A
(Continued)

FOREIGN PATENT DOCUMENTS

JP   2000-338901 A   12/2000
JP   2015-29270 A    2/2015
(Continued)

OTHER PUBLICATIONS

International Preliminary Report on Patentability and Written Opinion of the International Searching Authority (Forms PCT/IB/326, PCT/IB/373, and PCT/ISA/237) for International Application No. PCT/JP2020/014097, dated Oct. 7, 2021, with an English translation.

(Continued)

*Primary Examiner* — Suhan Ni
(74) *Attorney, Agent, or Firm* — Birch, Stewart, Kolasch & Birch, LLP

(57) ABSTRACT

An object is to provide a piezoelectric film that has excellent flexibility in a high temperature environment at higher than 50° C. and exhibits good flexibility even at room temperature, a laminated piezoelectric element in which the piezoelectric films are laminated, and an electroacoustic transducer using the piezoelectric film or the laminated piezoelectric element. The object is solved by the piezoelectric film including: a polymer-based piezoelectric composite material in which piezoelectric particles are dispersed in a matrix including a polymer material; and electrode layers provided on both surfaces of the polymer-based piezoelectric composite material, in which a loss tangent at a frequency of 1 Hz according to dynamic viscoelasticity measurement has a maximal value of greater than or equal to 0.1 existing in a temperature range of higher than 50° C. and (Continued)

lower than or equal to 150° C., and has a value of greater than or equal to 0.08 at 50° C.

17 Claims, 9 Drawing Sheets

(51) Int. Cl.
  *H10N 30/85* (2023.01)
  *H10N 30/88* (2023.01)
(58) Field of Classification Search
  USPC .......................................................... 381/190
  See application file for complete search history.

(56) References Cited

U.S. PATENT DOCUMENTS

| | | |
|---|---|---|
| 2016/0014526 A1 | 1/2016 | Miyoshi et al. |
| 2016/0021465 A1 | 1/2016 | Miyoshi |
| 2017/0331030 A1* | 11/2017 | Inoue .................. H10N 30/092 |

FOREIGN PATENT DOCUMENTS

| | | |
|---|---|---|
| WO | WO 2014/157684 A1 | 10/2014 |
| WO | WO 2014/162976 A1 | 10/2014 |
| WO | WO 2017/002573 A1 | 1/2017 |

OTHER PUBLICATIONS

International Search Report (Form PCT/ISA/210) for International Application No. PCT/JP2020/014097, dated Jun. 9, 2020, with an English translation.

* cited by examiner

PIEZOELECTRIC FILM, LAMINATED PIEZOELECTRIC ELEMENT, AND ELECTROACOUSTIC TRANSDUCER

CROSS-REFERENCE TO RELATED APPLICATIONS

This application is a Continuation of PCT International Application No. PCT/JP2020/014097 filed on Mar. 27, 2020, which claims priority under 35 U.S.C. § 119(a) to Japanese Patent Application No. 2019-062632 filed on Mar. 28, 2019 and Japanese Patent Application No. 2019-152708 filed on Aug. 23, 2019. Each of the above applications is hereby expressly incorporated by reference, in its entirety, into the present application.

BACKGROUND OF THE INVENTION

1. Field of the Invention

The present invention relates to a piezoelectric film used in an acoustic device such as a speaker and a microphone, a laminated piezoelectric element in which the piezoelectric films are laminated, and an electroacoustic transducer using the piezoelectric film or the laminated piezoelectric element.

2. Description of the Related Art

In recent years, research on a flexible display using a flexible substrate made of plastic or the like has been advanced.

As a substrate for such a flexible display, for example, JP2000-338901A discloses a flexible display substrate in which a gas barrier layer and a transparent conductive layer are laminated on a transparent plastic film.

A flexible display has superiority in lightness, thinness, flexibility, and the like compared to a display using a glass substrate in the related art, and can be provided on a curved surface of a cylinder or the like. In addition, the flexible display can be rolled to be stored and thus does not impair portability even with a large screen. Therefore, the flexible display has attracted attention as a display device for posting advertisements or the like and a display device of a personal digital assistant (PDA) or the like.

In a case where such a flexible display is used as an image display apparatus with a sound generator that reproduces a sound together with an image, such as a television receiver, a speaker that is an audio device for generating a sound is required.

Here, as a speaker shape in the related art, a funnel-shaped so-called cone shape, a spherical dome shape, or the like is generally used. However, in a case where such a speaker is to be embedded in the above-mentioned flexible display, there is concern that the lightness and flexibility, which are the advantages of the flexible display, may be impaired. In addition, in a case where the speaker is attached externally, it is inconvenient to transport the speaker, and it is difficult to install the speaker on a curved wall, so that there is concern that the appearance may be spoiled.

Under such circumstances, as a speaker that can be integrated into a flexible display without impairing lightness and flexibility, a piezoelectric film (electroacoustic transduction film) described in JP2015-29270A is known.

This piezoelectric film has a polymer-based piezoelectric composite material in which piezoelectric particles are dispersed in a viscoelastic matrix consisting of a polymer material having viscoelasticity at room temperature, thin film electrodes formed on both surfaces of the polymer-based piezoelectric composite material, and protective layers formed on the surfaces of the thin film electrodes, in which the loss tangent at a frequency of 1 Hz according to dynamic viscoelasticity measurement has a maximal value of greater than or equal to 0.1 existing in a temperature range 0° C. to 50° C.

SUMMARY OF THE INVENTION

In order to adopt a piezoelectric film as a speaker, it is necessary to convert a stretching and contracting movement along a film surface into a vibration of the film surface. This conversion from the stretching and contracting movement into the vibration is achieved by holding the piezoelectric film in a curved state, which makes it possible for the piezoelectric film to function as a speaker.

In the meanwhile, it is well known that the lowest resonance frequency $f_0$ of the vibration plate for a speaker is given by the following expression. Here, s is the stiffness of the vibration system and m is the mass.

Lowest resonance frequency:

$$f_0 = \frac{1}{2\pi}\sqrt{\frac{s}{m}}$$

Here, as the degree of curvature of the piezoelectric film, that is, the radius of curvature of the curved portion increases, the mechanical stiffness s decreases, so that the lowest resonance frequency $f_0$ decreases. That is, the acoustic quality (volume and frequency properties) of the speaker changes depending on the radius of curvature of the piezoelectric film.

In consideration of the above points, the piezoelectric film used as a speaker for a flexible display preferably meets the following requirements.

(i) Flexibility

For example, in a case of being gripped in a state of being loosely bent like a newspaper or a magazine as a portable device, the piezoelectric film is continuously subjected to large bending deformation from the outside at a relatively slow vibration of less than or equal to a few Hz. In this case, in a case where the piezoelectric film is hard, large bending stress is generated to that extent, and a crack is generated at the interface between a polymer matrix and piezoelectric particles, which may lead to breakage. Accordingly, the piezoelectric film is required to have suitable flexibility. In addition, in a case where strain energy is diffused into the outside as heat, the stress is able to be relieved. Therefore, the piezoelectric film is required to have a suitably large loss tangent.

(ii) Acoustic Quality

In a speaker, the piezoelectric particles vibrate at a frequency of an audio band of 20 Hz to 20 kHz, and the vibration energy causes the entire vibration plate (piezoelectric film) to vibrate integrally such that a sound is reproduced. Therefore, in order to increase the efficiency of transmitting the vibration energy, the piezoelectric film is required to have appropriate hardness. In addition, in a case where the frequency properties of the speaker are smoothened, the changed amount of acoustic quality in a case where the lowest resonance frequency $f_0$ is changed according to a change in the curvature of the speaker decreases. Therefore, the loss tangent of the piezoelectric film is required to be suitably large.

As described above, the piezoelectric film used as a speaker for a flexible display is required to be rigid with respect to a vibration of 20 Hz to 20 kHz, and be flexible with respect to a vibration of less than or equal to a few Hz. In addition, the loss tangent of a polymer-based piezoelectric composite material is required to be suitably large with respect to the vibration of all frequencies of less than or equal to 20 kHz.

The piezoelectric film described in JP2015-29270A satisfies the above-mentioned conditions at room temperature (0° C. to 50° C.) and exhibits excellent flexibility and acoustic quality.

However, the environment in which the speaker is used is not limited only to room temperature, and there are cases where the speaker is used in a high temperature environment at higher than 50° C. depending on the country, region, and place of use. However, it is difficult for the piezoelectric film described in JP2015-29270A to exhibit sufficient flexibility and acoustic quality in a high temperature environment at higher than 50° C.

An object of the present invention is to solve such a problem in the related art, and is to provide a piezoelectric film having excellent flexibility in a high temperature environment at higher than 50° C. and having good flexibility even at room temperature, a laminated piezoelectric element in which the piezoelectric films are laminated, and an electroacoustic transducer using the piezoelectric film or the laminated piezoelectric element.

In order to achieve the above-mentioned object, the present invention has the following configurations.

[1] A piezoelectric film comprising: a polymer-based piezoelectric composite material in which piezoelectric particles are dispersed in a matrix including a polymer material; and electrode layers formed on both surfaces of the polymer-based piezoelectric composite material, in which a loss tangent at a frequency of 1 Hz according to dynamic viscoelasticity measurement has a maximal value of greater than or equal to 0.1 existing in a temperature range of higher than 50° C. and lower than or equal to 150° C., and has a value of greater than or equal to 0.08 at 50° C.

[2] The piezoelectric film according to [1], further comprising: a protective layer provided on a surface of the electrode layer.

[3] The piezoelectric film according to [1] or [2], in which the piezoelectric film is polarized in a thickness direction.

[4] The piezoelectric film according to any one of [1] to [3], in which the piezoelectric film has no in-plane anisotropy in piezoelectric properties.

[5] The piezoelectric film according to any one of [1] to [4], further comprising: a lead wire for connecting the electrode layer to an external power source.

[6] A laminated piezoelectric element formed by laminating a plurality of layers of the piezoelectric films according to any one of [1] to [5].

[7] The laminated piezoelectric element according to [6], in which the piezoelectric films are polarized in a thickness direction, and polarization directions of the piezoelectric films adjacent to each other are opposite to each other.

[8] The laminated piezoelectric element according to [6] or [7], in which the laminated piezoelectric element is formed by laminating a plurality of layers of the piezoelectric film by folding back the piezoelectric film one or more times.

[9] The laminated piezoelectric element according to any one of [6] to [8], comprising: a bonding layer which bonds the piezoelectric films adjacent to each other.

[10] An electroacoustic transducer comprising: a vibration plate; and the piezoelectric film according to any one of [1] to [5], or the laminated piezoelectric element according to any one of [6] to [9].

[11] The electroacoustic transducer according to [10], in which a product of a thickness of the piezoelectric film or the laminated piezoelectric element and a storage elastic modulus at a frequency of 1 Hz and 25° C. according to dynamic viscoelasticity measurement is 0.1 to 3 times a product of a thickness of the vibration plate and a Young's modulus.

[12] The electroacoustic transducer according to [10] or [11], in which a product of a thickness of the piezoelectric film or the laminated piezoelectric element and a storage elastic modulus at a frequency of 1 kHz and 25° C. in a master curve obtained from dynamic viscoelasticity measurement is 0.3 to 10 times a product of a thickness of the vibration plate and a Young's modulus.

[13] The electroacoustic transducer according to any one of [10] to [12], further comprising: a bonding layer which bonds the vibration plate to the piezoelectric film or the laminated piezoelectric element.

According to the present invention, a piezoelectric film having excellent flexibility in a high temperature environment at higher than 50° C. and having good flexibility even at room temperature, a laminated piezoelectric element in which the piezoelectric films are laminated, and an electroacoustic transducer using the piezoelectric film or the laminated piezoelectric element are provided.

DESCRIPTION OF THE PREFERRED EMBODIMENTS

Hereinafter, a piezoelectric film, a laminated piezoelectric element, and an electroacoustic transducer of an embodiment of the present invention will be described in detail based on the suitable examples shown in the accompanying drawings.

Descriptions of the constituent requirements described below may be made based on representative embodiments of the present invention, but the present invention is not limited to such embodiments.

In the present specification, a numerical range expressed using "to" means a range including numerical values described before and after "to" as a lower limit and an upper limit.

Figure 1:
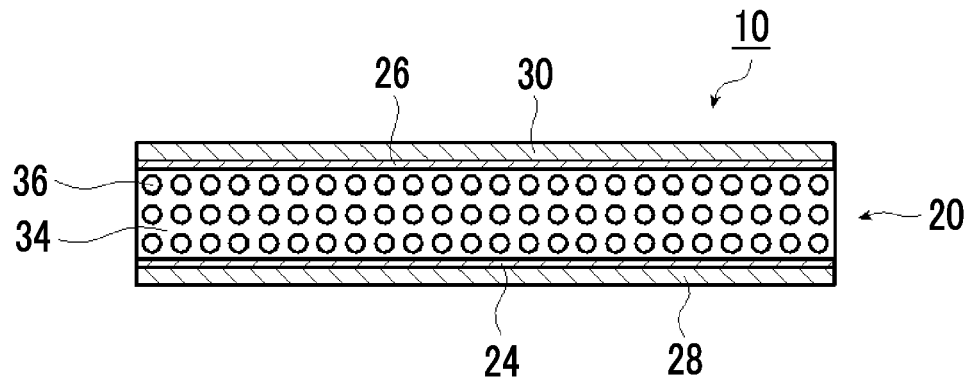
FIG. 1 is a conceptual diagram of an example of a piezoelectric film of an embodiment of the present invention.

FIG. 1 conceptually illustrates an example of the piezoelectric film of the embodiment of the present invention in a cross-sectional view.

As illustrated in FIG. 1, a piezoelectric film 10 has a piezoelectric layer 20 which is a sheet-like material having piezoelectric properties, a lower electrode 24 laminated on one surface of the piezoelectric layer 20, a lower protective layer 28 laminated on the lower electrode 24, an upper electrode 26 laminated on the other surface of the piezoelectric layer 20, and an upper protective layer 30 laminated on the upper electrode 26.

The piezoelectric layer 20 is formed by dispersing piezoelectric particles 36 in a matrix 34 including a polymer material. That is, the piezoelectric layer 20 is a polymer-based piezoelectric composite material of the embodiment of the present invention.

As will be described later, the piezoelectric film 10 (piezoelectric layer 20) is polarized in a thickness direction as a preferable embodiment.

As an example, the piezoelectric film 10 is used in various acoustic devices (audio equipment) such as speakers, microphones, and pickups used in musical instruments such as guitars, to generate (reproduce) a sound due to vibration in response to an electrical signal or convert vibration due to a sound into an electrical signal.

The piezoelectric film can also be used in pressure-sensitive sensors, power generation elements, and the like.

As described above, the piezoelectric film used in a flexible speaker or the like preferably has good flexibility and acoustic quality.

That is, the piezoelectric film is required to be rigid with respect to a vibration of 20 Hz to 20 kHz, and to be flexible with respect to a vibration of less than or equal to a few Hz. The loss tangent of the piezoelectric film 10 is required to be suitably large with respect to the vibration of all frequencies of less than or equal to 20 kHz.

In general, a polymer solid has a viscoelasticity relieving mechanism, and a molecular movement having a large scale is observed as a decrease (relief) in a storage elastic modulus (Young's modulus) or a maximal value (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the piezoelectric film 10 of the embodiment of the present invention, the loss tangent (tan δ) at a frequency of 1 Hz according to dynamic viscoelasticity measurement has one or more maximal values of greater than or equal to 0.1 existing in a temperature range of higher than 50° C. and lower than or equal to 150° C. In addition, in the piezoelectric film 10 of the embodiment of the present invention, the value of the loss tangent at a frequency of 1 Hz according to the dynamic viscoelasticity measurement and at 50° C. is greater than or equal to 0.08.

Accordingly, the piezoelectric film 10 of the embodiment of the present invention has extremely high flexibility in a high temperature environment at higher than 50° C. and also has good flexibility even at room temperature. Furthermore, the piezoelectric film 10 of the embodiment of the present invention is rigid with respect to a fast vibration of 20 Hz to 20 kHz and is flexible with respect to a slow vibration of less than or equal to a few Hz in a high temperature environment at higher than 50° C.

In the present invention, the "room temperature" indicates a temperature range of approximately 0° C. to 50° C.

The piezoelectric layer 20 is formed by dispersing the piezoelectric particles 36 in the matrix 34.

As an example, the piezoelectric film 10 of the embodiment of the present invention uses, as the matrix 34 of the piezoelectric layer 20 (polymer-based piezoelectric composite material), a mixed polymer material in which a polymer material having a glass transition point at room temperature and a polymer material having a glass transition point of higher than 50° C. are mixed.

The polymer material having a glass transition point at room temperature is, that is, a polymer material having viscoelasticity at room temperature. On the other hand, the polymer material having a glass transition point of higher than 50° C. is a polymer material having viscoelasticity in a temperature range of higher than 50° C.

By using the mixed polymer material as the matrix 34 of the piezoelectric layer 20, the piezoelectric film 10 in which the loss tangent (tan δ) at a frequency of 1 Hz according to the dynamic viscoelasticity measurement has a maximal value of greater than or equal to 0.1 existing in a temperature range of higher than 50° C. and lower than or equal to 150° C. and has a value of greater than or equal to 0.08 at 50° C. is obtained.

In the piezoelectric film 10 of the embodiment of the present invention, the loss tangent at a frequency of 1 Hz according to the dynamic viscoelasticity measurement has one or more maximal values of greater than or equal to 0.1 existing in a temperature range of higher than 50° C. and lower than or equal to 150° C.

Accordingly, in a case where the piezoelectric film 10 is slowly bent due to an external force in a high temperature environment at higher than 50° C., the piezoelectric film 10 of the embodiment of the present invention can effectively diffuse the strain energy to the outside as heat. Therefore, in the piezoelectric film 10, stress concentration on the interface between the matrix 34 and the piezoelectric particles 36 at the maximum bending moment portion is relieved, and the generation of a crack on the interface between the matrix 34 and the piezoelectric particles 36 can be prevented. As a result, in a high temperature environment at higher than 50° C., the piezoelectric film 10 of the embodiment of the present invention has extremely high flexibility with respect to a slow movement due to an external force such as bending by a user and rolling. The same applies to the laminated piezoelectric element and the electroacoustic transducer, which will be described later, with respect to the above points.

The maximal value of the loss tangent at a frequency of 1 Hz in a temperature range of higher than 50° C. and lower than or equal to 150° C. is preferably greater than or equal to 0.3, and more preferably greater than or equal to 0.5.

The loss tangent at a frequency of 1 Hz may have a plurality of maximal values of greater than or equal to 0.1 existing in a temperature range of higher than 50° C. and lower than or equal to 150° C.

In addition, in the piezoelectric film 10 of the embodiment of the present invention, the value of the loss tangent at a frequency of 1 Hz according to the dynamic viscoelasticity measurement and at 50° C. is greater than or equal to 0.08.

The use environment of the piezoelectric film 10 is not limited to the high temperature environment at higher than 50° C. The piezoelectric film is manufactured by a manufacturing method including winding such as roll-to-roll, but the temperature of the manufacturing environment is usually room temperature. Therefore, the piezoelectric film 10 is required to have a certain degree of flexibility even in an environment at room temperature.

Contrary to this, the piezoelectric film of the embodiment of the present invention has a loss tangent of greater than or equal to 0.08 at a frequency of 1 Hz and 50° C. in addition to the maximal value of the loss tangent in a high temperature range described above. Therefore, for the same reasons as described above, the piezoelectric film of the embodiment of the present invention exhibits good handleability and good flexibility that enables various manufacturing methods even in an environment at room temperature. The same applies to the laminated piezoelectric element and the electroacoustic transducer, which will be described later, with respect to the above points.

The loss tangent at 50° C. and a frequency of 1 Hz is preferably greater than or equal to 0.10, and more preferably greater than or equal to 0.15.

In the piezoelectric film 10 of the embodiment of the present invention, the maximal value of the loss tangent at 1 Hz may exist or may not exist in a temperature range of room temperature.

In the piezoelectric film 10 of the embodiment of the present invention, since the loss tangent at 1 Hz has one or more maximal values existing in a temperature range of room temperature, the piezoelectric film 10 in a room temperature environment achieves better flexibility. In the piezoelectric film 10 of the embodiment of the present invention, in a case where the maximal value of the loss tangent at 1 Hz exists in a temperature range of room temperature, the maximal value of the loss tangent is preferably greater than or equal to 0.08.

As described above, in the piezoelectric film 10 of the embodiment of the present invention, the mixed polymer material of the polymer material having viscoelasticity at room temperature and the polymer material having viscoelasticity in a temperature range of higher than 50° C. is used as the matrix 34 of the piezoelectric layer 20.

As the polymer material having viscoelasticity at room temperature, various known materials are able to be used as long as the materials have dielectric properties. Preferably, as the polymer material, a polymer material of which the maximal value of a loss tangent at a frequency of 1 Hz according to a dynamic viscoelasticity test at room temperature is greater than or equal to 0.08 is used.

Accordingly, in a case where the piezoelectric film 10 is slowly bent due to an external force at room temperature, stress concentration on the interface between the matrix 34 and the piezoelectric particles 36 at the maximum bending moment portion is relieved, and thus good flexibility is obtained.

In addition, it is preferable that, in the polymer material having viscoelasticity at room temperature, a storage elastic modulus (E') at a frequency of 1 Hz according to the dynamic viscoelasticity measurement is greater than or equal to 100 MPa at 0° C. and is less than or equal to 10 MPa at 50° C.

Accordingly, it is possible to reduce a bending moment which is generated in a case where the piezoelectric film 10 is slowly bent due to the external force, and it is possible to make the piezoelectric film 10 rigid with respect to an acoustic vibration of 20 Hz to 20 kHz.

In addition, it is more suitable that the relative permittivity of the polymer material having viscoelasticity at room temperature is greater than or equal to 10 at 25° C. Accordingly, in a case where a voltage is applied to the piezoelectric film 10, a higher electric field is applied to the piezoelectric particles in the matrix, and thus a large deformation amount is able to be expected.

However, in consideration of securing good moisture resistance or the like, it is suitable that the relative permittivity of the polymer material is less than or equal to 10 at 25° C.

As the polymer material having viscoelasticity at room temperature and satisfying such conditions, cyanoethylated polyvinyl alcohol (cyanoethylated PVA (CR-V)), polyvinyl acetate, polyvinylidene chloride-co-acrylonitrile, a polystyrene-vinyl polyisoprene block copolymer, polyvinyl methyl ketone, polybutyl methacrylate, and the like are exemplified.

In addition, as these polymer materials, a commercially available product such as Hybrar 5127 (manufactured by Kuraray Co., Ltd.) is also able to be suitably used. Among them, as the polymer material having viscoelasticity at room temperature, a material having a cyanoethyl group is preferably used, and cyanoethylated PVA is particularly preferably used.

Furthermore, only one of these polymer materials may be used, or a plurality of types thereof may be used in combination (mixture).

The mixed polymer material is obtained by mixing such a polymer material having viscoelasticity at room temperature with a polymer material having a glass transition point of higher than 50° C., that is, a polymer material having viscoelasticity in a temperature range of higher than 50° C. In the following description, "a polymer material having viscoelasticity in a temperature range of higher than 50° C." is also referred to as "a polymer material having viscoelasticity at a high temperature" for convenience.

In the piezoelectric film 10 of the embodiment of the present invention, by using the mixed polymer material obtained by mixing the polymer material having viscoelasticity at room temperature with the polymer material having viscoelasticity at a high temperature as the matrix 34 included in the piezoelectric layer 20, the glass transition point of the matrix 34 is improved, so that both excellent flexibility in a high temperature environment at higher than 50° C. and good flexibility in a room temperature environment are achieved.

As the polymer material having viscoelasticity at a high temperature, various materials are able to be used as long as the material has a glass transition point of higher than 50° C. and has dielectric properties.

As an example, cyanoethylated pullulan (CR-S) and the like are exemplified.

In the matrix 34 included in the piezoelectric layer 20, there is no limit to the amount of the polymer material having viscoelasticity at a high temperature added to the polymer material having viscoelasticity at room temperature.

The amount of the added polymer material having viscoelasticity at a high temperature is preferably 31 to 80 mass %, more preferably 41 to 70 mass %, and even more preferably 51 to 60 mass % with respect to the mixed polymer material in which the polymer material having viscoelasticity at room temperature and the polymer material having viscoelasticity at a high temperature are mixed.

By setting the amount of the added polymer material having viscoelasticity at a high temperature to more than or equal to 31 mass %, an effect of adding the polymer material having viscoelasticity at a high temperature is suitably exhibited, and the piezoelectric film 10 exhibiting excellent flexibility in a high temperature environment at higher than 50° C. is obtained, which is preferable.

By setting the amount of the added polymer material having viscoelasticity at a high temperature to less than or equal to 80 mass %, the flexibility at room temperature can be improved, which is preferable.

For the purpose of controlling dielectric properties or mechanical properties or the like, other dielectric polymer materials may be added to the matrix 34 in addition to the polymer material having viscoelasticity at room temperature and the polymer material having viscoelasticity at a high temperature, as necessary.

In addition, for the purpose of controlling the glass transition point, a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, or mica may be added to the matrix 34 in addition to the dielectric polymer materials.

Furthermore, for the purpose of improving pressure sensitive adhesiveness, a viscosity imparting agent such as rosin ester, rosin, terpene, terpene phenol, and a petroleum resin may be added.

The piezoelectric layer 20 is a polymer-based piezoelectric composite material in which the piezoelectric particles 36 are dispersed in the matrix 34.

The piezoelectric particles 36 consist of ceramics particles having a perovskite type or wurtzite type crystal structure.

As the ceramics particles forming the piezoelectric particles 36, for example, lead zirconate titanate (PZT), lead lanthanum zirconate titanate (PLZT), barium titanate (BaTiO$_3$), zinc oxide (ZnO), and a solid solution (BFBT) of barium titanate and bismuth ferrite (BiFe$_3$) are exemplified.

Only one of these piezoelectric particles 36 may be used, or a plurality of types thereof may be used in combination (mixture).

The particle diameter of the piezoelectric particles 36 is not limited, and may be appropriately selected depending on the size, usage, and the like of the piezoelectric film 10.

The particle diameter of the piezoelectric particles 36 is preferably 1 to 10 μm. By setting the particle diameter of the piezoelectric particles 36 to be in this range, a preferable result is able to be obtained from a viewpoint of allowing the piezoelectric film 10 to achieve both high piezoelectric properties and flexibility.

In addition, in FIG. 1, the piezoelectric particles 36 in the piezoelectric layer 20 are uniformly dispersed in the matrix 34 with regularity. However, the present invention is not limited thereto.

That is, in the matrix 34, the piezoelectric particles 36 in the piezoelectric layer 20 are preferably uniformly dispersed, and may also be irregularly dispersed.

In the piezoelectric film 10, there is no limitation on a quantitative ratio of the matrix 34 and the piezoelectric particles 36 in the piezoelectric layer 20. The quantitative ratio of the matrix 34 and the piezoelectric particles 36 in the piezoelectric layer 20 may be appropriately set according to the size in the surface direction or the thickness of the piezoelectric film 10, the usage of the piezoelectric film 10, properties required for the piezoelectric film 10, and the like.

The volume fraction of the piezoelectric particles 36 in the piezoelectric layer 20 is preferably 30% to 80%, and more preferably more than or equal to 50%. Therefore, the volume fraction of the piezoelectric particles 36 in the piezoelectric layer 20 is more preferably set to 50% to 80%.

By setting the quantitative ratio of the matrix 34 and the piezoelectric particles 36 to be in the range described above, it is possible to obtain a preferable result from a viewpoint of achieving both high piezoelectric properties and flexibility.

In the piezoelectric film 10, the thickness of the piezoelectric layer 20 is not limited, and may be appropriately set according to the usage of the piezoelectric film 10, the properties required for the piezoelectric film 10, and the like. The thicker the piezoelectric layer 20, the more advantageous it is in terms of rigidity such as the stiffness of a so-called sheet-like material, but the voltage (potential difference) required to stretch and contract the piezoelectric film 10 by the same amount increases.

The thickness of the piezoelectric layer 20 is preferably 10 to 300 μm, more preferably 20 to 200 μm, and even more preferably 30 to 150 μm.

By setting the thickness of the piezoelectric layer 20 to be in the range described above, it is possible to obtain a preferable result from a viewpoint of compatibility between securing the rigidity and appropriate flexibility, or the like.

In the piezoelectric film 10 of the embodiment of the present invention, for the same reason as the piezoelectric film 10 described above, it is preferable that in the piezoelectric layer 20 (polymer-based piezoelectric composite material), the loss tangent at a frequency of 1 Hz according to the dynamic viscoelasticity measurement has one or more maximal values of greater than or equal to 0.1 existing in a temperature range of higher than 50° C. and lower than or equal to 150° C. In addition, in the piezoelectric layer 20, the maximal value of the loss tangent at a frequency of 1 Hz in a temperature range of higher than 50° C. and lower than or equal to 150° C. is preferably greater than or equal to 0.3, and more preferably greater than or equal to 0.5.

Furthermore, i the piezoelectric layer 20, the loss tangent at a frequency of 1 Hz may have a plurality of maximal values of greater than or equal to 0.1 existing in a temperature range of higher than 50° C. and lower than or equal to 150° C.

In the piezoelectric film 10 of the embodiment of the present invention, for the same reason as the piezoelectric film 10 described above, in the piezoelectric layer 20, the value of the loss tangent at a frequency of 1 Hz according to the dynamic viscoelasticity measurement and at 50° C. is preferably greater than or equal to 0.08.

In the piezoelectric layer 20, the loss tangent at 50° C. and a frequency of 1 Hz is preferably greater than or equal to 0.07, and more preferably greater than or equal to 0.1.

Furthermore, in the piezoelectric layer 20 of the piezoelectric film 10 of the embodiment of the present invention, the maximal value of the loss tangent at 1 Hz may exist or may not exist in a temperature range of room temperature.

However, for the same reason as the piezoelectric film 10 described above, it is preferable that in the piezoelectric layer 20, the loss tangent at 1 Hz may have one or more maximal values existing in a temperature range of room temperature. In the piezoelectric layer 20, in a case where the maximal value of the loss tangent at 1 Hz exists in a temperature range of room temperature, the maximal value of the loss tangent is preferably greater than or equal to 0.08.

As illustrated in FIG. 1, the piezoelectric film 10 of the illustrated example has a configuration in which the lower electrode 24 is provided on one surface of the piezoelectric layer 20, the lower protective layer 28 is provided on the surface thereof, the upper electrode 26 is provided on the other surface of the piezoelectric layer 20, and the upper protective layer 30 is provided on the surface thereof. Here, the upper electrode 26 and the lower electrode 24 form an electrode pair.

In addition to these layers, the piezoelectric film 10 has, for example, an electrode lead portion that leads out the electrodes from the upper electrode 26 and the lower electrode 24, and the electrode lead portion is connected to a power source PS. Furthermore, the piezoelectric film 10 may have an insulating layer which covers a region where the piezoelectric layer 20 is exposed for preventing a short circuit or the like.

That is, the piezoelectric film 10 has a configuration in which both surfaces of the piezoelectric layer 20 are interposed between the electrode pair, that is, the upper electrode 26 and the lower electrode 24 and the laminate is further interposed between the lower protective layer 28 and the upper protective layer 30.

As described above, in the piezoelectric film 10, the region interposed between the upper electrode 26 and the lower electrode 24 is stretched and contracted according to an applied voltage.

In the piezoelectric film 10, the lower protective layer 28 and the upper protective layer 30 are provided as a preferable embodiment rather than essential constituent requirements.

The lower protective layer 28 and the upper protective layer 30 have a function of covering the upper electrode 26 and the lower electrode 24 and applying appropriate rigidity and mechanical strength to the piezoelectric layer 20. That is, there may be a case where, in the piezoelectric film 10, the piezoelectric layer 20 consisting of the matrix 34 and the piezoelectric particles 36 exhibits extremely superior flexibility under bending deformation at a slow vibration but has insufficient rigidity or mechanical strength depending on the usage. As a compensation for this, the piezoelectric film 10 is provided with the lower protective layer 28 and the upper protective layer 30.

The lower protective layer 28 and the upper protective layer 30 are not limited, and may use various sheet-like materials. As an example, various resin films are suitably exemplified.

Among them, by the reason of excellent mechanical properties and heat resistance, a resin film consisting of polyethylene terephthalate (PET), polypropylene (PP), polystyrene (PS), polycarbonate (PC), polyphenylene sulfide (PPS), polymethylmethacrylate (PMMA), polyetherimide (PEI), polyimide (PI), polyethylene naphthalate (PEN), triacetyl cellulose (TAC), or a cyclic olefin-based resin is suitably used.

There is also no limitation on the thicknesses of the lower protective layer 28 and the upper protective layer 30. In addition, the thicknesses of the lower protective layer 28 and the upper protective layer 30 may basically be the same or different from each other.

Here, in a case where the rigidity of the lower protective layer 28 and the upper protective layer 30 is too high, not only is the stretching and contracting of the piezoelectric layer 20 constrained, but also the flexibility is impaired. Therefore, it is advantageous in a case where the thicknesses of lower protective layer 28 and the upper protective layer 30 are smaller unless mechanical strength or good handleability as a sheet-like material is required.

In the piezoelectric film 10, in a case where the thickness of the lower protective layer 28 and the upper protective layer 30 is at most twice the thickness of the piezoelectric layer 20, it is possible to obtain a preferable result from a viewpoint of compatibility between securing the rigidity and appropriate flexibility, or the like.

For example, in a case where the thickness of the piezoelectric layer 20 is 50 μm and the lower protective layer 28 and the upper protective layer 30 consist of PET, the thickness of the upper protective layer 30 and the lower protective layer 28 is preferably less than or equal to 100 μm, more preferably less than or equal to 50 μm, and even more preferably less than or equal to 25 μm.

In the piezoelectric film 10, the lower electrode 24 is formed between the piezoelectric layer 20 and the lower protective layer 28, and the upper electrode 26 is formed between the piezoelectric layer 20 and the upper protective layer 30.

The lower electrode 24 and the upper electrode 26 are provided to apply a driving voltage to the piezoelectric layer 20.

In the present invention, a forming material of the lower electrode 24 and the upper electrode 26 is not limited, and as the forming material, various conductors are able to be used. Specifically, carbon, palladium, iron, tin, aluminum, nickel, platinum, gold, silver, copper, titanium, chromium, and molybdenum, alloys thereof, laminates and composites of these metals and alloys, indium-tin oxide, and the like are exemplified. Among them, copper, aluminum, gold, silver, platinum, and indium-tin oxide are suitably exemplified as the lower electrode 24 and the upper electrode 26.

In addition, a forming method of the lower electrode 24 and the upper electrode 26 is not limited, and various known methods such as a vapor-phase deposition method (a vacuum film forming method) such as vacuum vapor deposition or sputtering, film formation using plating, and a method of bonding a foil formed of the materials described above are able to be used.

Among them, in particular, by the reason that the flexibility of the piezoelectric film 10 is able to be secured, a thin film made of copper, aluminum, or the like formed by using the vacuum vapor deposition is suitably used as the lower electrode 24 and the upper electrode 26. Among them, in particular, the copper thin film formed by using the vacuum vapor deposition is suitably used.

There is no limitation on the thickness of the lower electrode 24 and the upper electrode 26. In addition, the thicknesses of the lower electrode 24 and the upper electrode 26 may basically be the same or different from each other.

Here, similarly to the lower protective layer 28 and upper protective layer 30 mentioned above, in a case where the rigidity of the lower electrode 24 and the upper electrode 26 is too high, not only is the stretching and contracting of the piezoelectric layer 20 constrained, but also the flexibility is impaired. Therefore, it is advantageous in a case where the thicknesses of lower electrode 24 and the upper electrode 26 are smaller as long as electrical resistance is not excessively high. That is, the lower electrode 24 and the upper electrode 26 are preferably thin film electrodes.

In the piezoelectric film 10, in a case where the product of the thicknesses of the lower electrode 24 and the upper electrode 26 and the Young's modulus is less than the product of the thicknesses of the lower protective layer 28 and the upper protective layer 30 and the Young's modulus, the flexibility is not considerably impaired, which is suitable.

For example, in a case of a combination consisting of the lower protective layer 28 and the upper protective layer 30 formed of PET (Young's modulus: approximately 6.2 GPa) and the lower electrode 24 and the upper electrode 26 formed of copper (Young's modulus: approximately 130 GPa), in a case where the thickness of the lower protective layer 28 and the upper protective layer 30 is 25 μm, the thickness of the upper electrode 26 and the lower electrode 24 is preferably less than or equal to 1.2 μm, more preferably less than or equal to 0.3 μm, and even more preferably less than or equal to 0.1 μm.

In the piezoelectric film 10, it is preferable that the storage elastic modulus (E') at a frequency of 1 Hz according to the dynamic viscoelasticity measurement is 10 to 30 GPa at 50° C., and 1 to 10 GPa at 120° C. Regarding this condition, the same applies to the piezoelectric layer 20.

Accordingly, in a high temperature environment at higher than 50° C., the piezoelectric film 10 is able to have large frequency dispersion in the storage elastic modulus. That is, the piezoelectric film 10 is able to be rigid with respect to a vibration of 20 Hz to 20 kHz, and is able to be flexible with respect to a vibration of less than or equal to a few Hz.

In addition, in the piezoelectric film 10, it is preferable that the product of the thickness and the storage elastic modulus at a frequency of 1 Hz according to the dynamic viscoelasticity measurement is $2.0 \times 10^5$ to $5.0 \times 10^6$ N/m at 50° C., and $1.0 \times 10^5$ to $2.0 \times 10^6$ N/m at 120° C. Regarding this condition, the same applies to the piezoelectric layer 20.

Accordingly, in a high temperature environment at higher than 50° C., the piezoelectric film 10 is able to have appropriate rigidity and mechanical strength within a range not impairing the flexibility and the acoustic properties.

Furthermore, in the piezoelectric film 10, it is preferable that the loss tangent at a frequency of 1 kHz at 25° C. is greater than or equal to 0.05 in a master curve obtained from the dynamic viscoelasticity measurement. Regarding this condition, the same applies to the piezoelectric layer 20.

Accordingly, the frequency properties of a speaker using the piezoelectric film 10 are smoothened, and thus it is possible to decrease the change in acoustic quality in a case where the lowest resonance frequency $f_0$ is changed according to a change in the curvature of the speaker.

In the present invention, measurement (dynamic viscoelasticity measurement) of the storage elastic modulus (Young's modulus) and the loss tangent of the piezoelectric film 10, the piezoelectric layer 20, a laminated piezoelectric element 14 and a vibration plate 12, which will be described later, and the like may be performed by a known method using a dynamic viscoelasticity measuring machine. Examples of the dynamic viscoelasticity measuring machine include the DMS6100 viscoelasticity spectrometer manufactured by SII NanoTechnology Inc.

Examples of the measurement conditions include a measurement frequency of 0.1 to 20 Hz (0.1 Hz, 0.2 Hz, 0.5 Hz, 1 Hz, 2 Hz, 5 Hz, 10 Hz, and 20 Hz), a measurement temperature of 50° C. to 170° C., a temperature rising rate of 2° C./min (in a nitrogen atmosphere), a sample size of 40 mm×10 mm (including the clamped region), and a chuck-to-chuck distance of 20 mm.

Next, an example of a manufacturing method of the piezoelectric film 10 will be described with reference to FIGS. 2 to 6.

Figure 2:
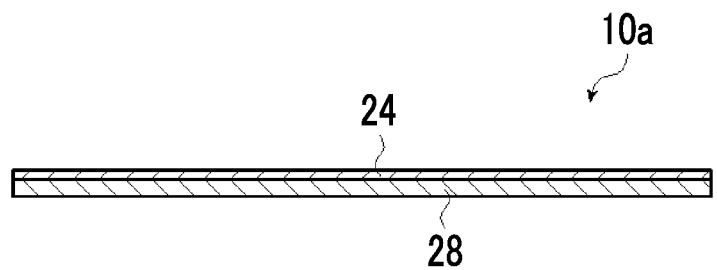
FIG. 2 is a conceptual diagram for describing an example of a production method of the piezoelectric film.

First, as illustrated in FIG. 2, a sheet-like material 10a is prepared in which the lower electrode 24 is formed on the lower protective layer 28. The sheet-like material 10a may be produced by forming a copper thin film or the like as the lower electrode 24 on the surface of the lower protective layer 28 using vacuum vapor deposition, sputtering, plating, or the like.

In a case where the lower protective layer 28 is extremely thin, and thus the handleability is degraded, the lower protective layer 28 with a separator (temporary support) may be used as necessary. As the separator, a PET having a thickness of 25 to 100 μm, and the like are able to be used. The separator may be removed after thermal compression bonding of the upper electrode 26 and the upper protective layer 30 and before laminating any member on the lower protective layer 28.

On the other hand, a coating material is prepared by dissolving the polymer material having viscoelasticity at room temperature and the polymer material having viscoelasticity at a high temperature, in an organic solvent, further adding the piezoelectric particles 36 such as PZT particles thereto, and stirring and dispersing the resultant material. In the following description, in a case where it is not necessary to distinguish between the polymer material having viscoelasticity at room temperature and the polymer material having viscoelasticity at a high temperature, both are collectively referred to as "viscoelastic material".

The organic solvent is not limited, and various organic solvents such as dimethylformamide (DMF), methyl ethyl ketone, and cyclohexanone are able to be used.

Figure 3:
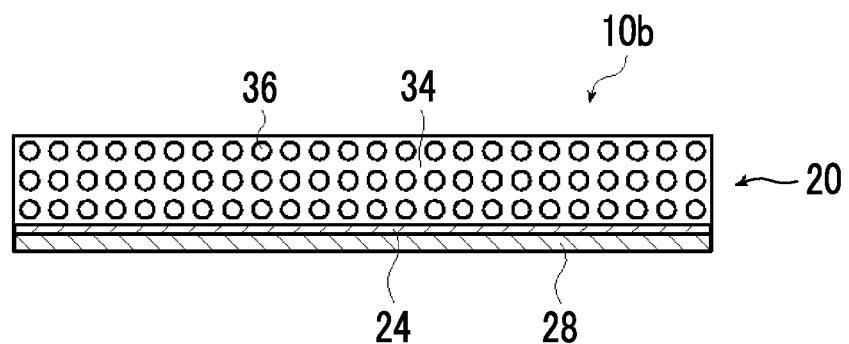
FIG. 3 is a conceptual diagram for describing an example of the production method of the piezoelectric film.

In a case where the sheet-like material 10a is prepared and the coating material is prepared, the coating material is cast (applied) onto the sheet-like material 10a, and the organic solvent is evaporated and dried. Accordingly, as illustrated in FIG. 3, a laminate 10b in which the lower electrode 24 is provided on the lower protective layer 28 and the piezoelectric layer 20 is formed on the lower electrode 24 is produced. The lower electrode 24 refers to an electrode on the base material side in a case where the piezoelectric layer 20 is applied, and does not indicate the vertical positional relationship in the laminate.

A casting method of the coating material is not limited, and all known methods (coating devices) such as a slide coater or a doctor knife are able to be used.

Alternatively, in a case where the viscoelastic material is a material that is able to be heated and melted like cyanoethylated PVA, a melted material may be produced by heating and melting the viscoelastic material and adding and dispersing the piezoelectric particles 36 therein, extruded into a sheet shape on the sheet-like material 10a illustrated in FIG. 2 by extrusion molding or the like, and cooled, thereby producing the laminate 10b in which the lower electrode 24 is provided on the lower protective layer 28 and the piezoelectric layer 20 is formed on the lower electrode 24 as illustrated in FIG. 3.

As described above, in the piezoelectric film 10, in addition to the viscoelastic material such as cyanoethylated PVA, a dielectric polymer material such as PVDF may be added to the matrix 34.

In a case where the polymer material is added to the matrix 34, the polymer material added to the coating material may be dissolved. Alternatively, the polymer material to be added may be added to the heated and melted viscoelastic material and may be heated and melted.

After the laminate 10b in which the lower electrode 24 is provided on the lower protective layer 28 and the piezoelectric layer 20 is formed on the lower electrode 24 is produced, the piezoelectric layer 20 is subjected to polarization processing (poling).

A polarization processing method of the piezoelectric layer 20 is not limited, and a known method is able to be used. As a preferable polarization processing method, a method illustrated in FIGS. 4 and 5 is exemplified.

Figure 4:
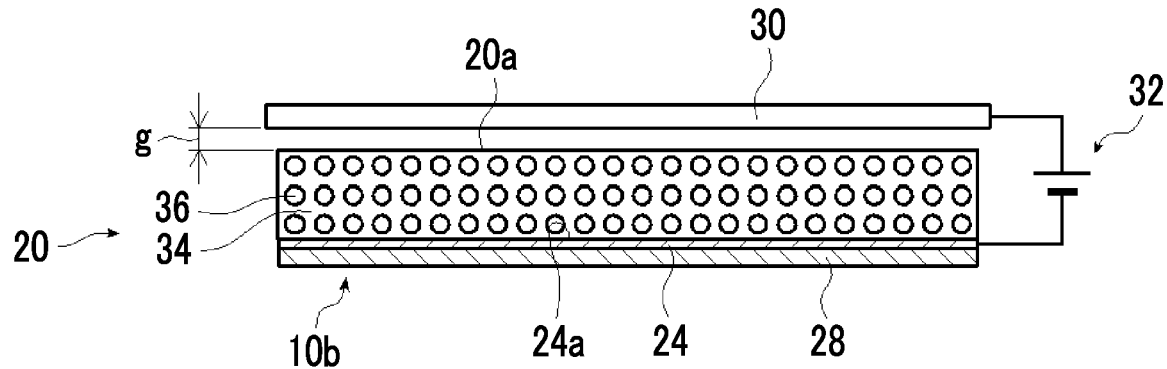
FIG. 4 is a conceptual diagram for describing an example of the production method of the piezoelectric film.
Figure 5:
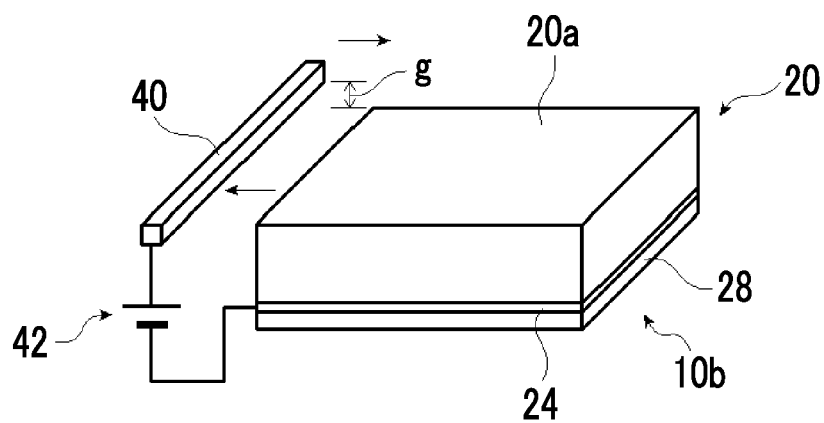
FIG. 5 is a conceptual diagram for describing an example of the production method of the piezoelectric film.

In this method, as illustrated in FIGS. 4 and 5, for example, an interval g of 1 mm is opened on an upper surface 20a of the piezoelectric layer 20 of the laminate 10b, and a rod-like or wire-like corona electrode 40 which is able to be moved along the upper surface 20a is provided. Then, the corona electrode 40 and the lower electrode 24 are connected to a direct-current power source 42.

Furthermore, a heating unit for heating and holding the laminate 10b, for example, a hot plate, is prepared.

Then, in a state where the piezoelectric layer 20 is heated and held by the heating unit, for example, at a temperature of 100° C., a direct-current voltage of a few kV, for example, 6 kV, is applied between the lower electrode 24 and the corona electrode 40 from the direct-current power source 42, and thus a corona discharge occurs. Furthermore, in a state where the interval g is maintained, the corona electrode 40 is moved (scanned) along the upper surface 20a of the piezoelectric layer 20, and the piezoelectric layer 20 is subjected to the polarization processing.

Accordingly, the piezoelectric layer 20 is polarized in the thickness direction.

In the polarization processing using such corona discharge, a known rod-like moving unit may be used to move the corona electrode 40. In the following description, for convenience, the polarization processing using corona discharge is also referred to as corona poling processing.

In addition, in the corona poling processing, a method of moving the corona electrode 40 is not limited. That is, the corona electrode 40 is fixed, a moving mechanism for moving the laminate 10b is provided, and the polarization processing may be performed by moving the laminate 10b. A known moving unit for moving a sheet-like material may be used to move the laminate 10b.

Furthermore, the number of corona electrodes 40 is not limited to one, and the corona poling processing may be performed by using a plurality of corona electrodes 40.

In addition, the polarization processing is not limited to the corona poling processing, and normal electric field poling in which a direct-current electric field is directly applied to an object to be subjected to the polarization processing may also be used. However, in a case where this normal electric field poling is performed, it is necessary that the upper electrode 26 is formed before the polarization processing.

Before the polarization processing, calender processing may be performed to smoothen the surface of the piezoelectric layer 20 using a heating roller or the like. By performing the calender processing, a thermal compression bonding process described below is able to be smoothly performed.

In this way, while the piezoelectric layer 20 of the laminate 10b is subjected to the polarization processing, a sheet-like material 10c is prepared in which the upper electrode 26 is formed on the upper protective layer 30. This sheet-like material 10c may be produced by forming a copper thin film or the like as the upper electrode 26 on the surface of the upper protective layer 30 using vacuum vapor deposition, sputtering, plating, or the like.

Figure 6:
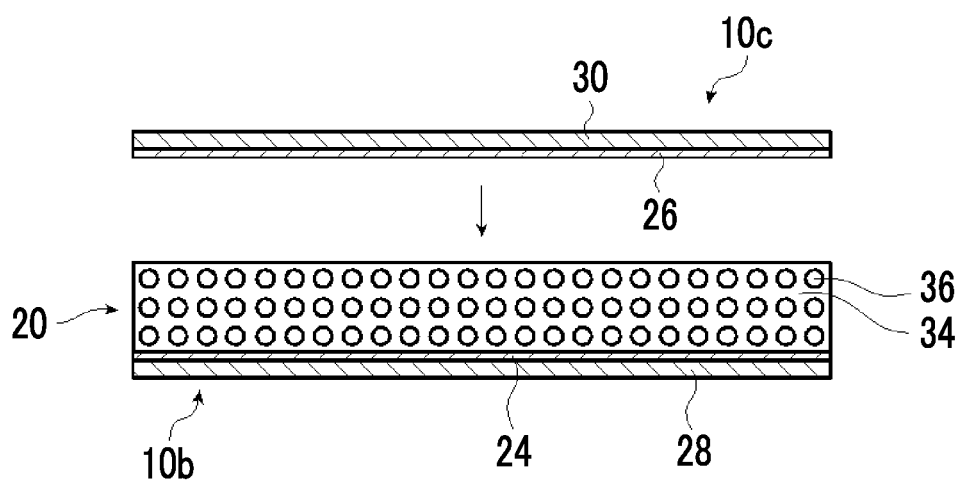
FIG. 6 is a conceptual diagram for describing an example of the production method of the piezoelectric film.

Next, as illustrated in FIG. 6, the sheet-like material 10c is laminated on the laminate 10b in which the piezoelectric layer 20 is subjected to the polarization processing while the upper electrode 26 faces the piezoelectric layer 20.

Furthermore, a laminate of the laminate 10b and the sheet-like material 10c is interposed between the upper protective layer 30 and the lower protective layer 28, and is subjected to the thermal compression bonding using a heating press device, a heating roller pair, or the like such that the piezoelectric film 10 is produced.

As will be described later, the laminated piezoelectric element 14 of the embodiment of the present invention has a configuration in which the piezoelectric films 10 of the embodiment of the present invention are laminated and bonded to each other by a bonding layer 19 as a preferable embodiment. In the laminated piezoelectric element 14 illustrated in FIG. 8, as indicated by the arrows attached to the piezoelectric layer 20 as a preferable embodiment, the polarization directions of the piezoelectric films 10 adjacent to each other are opposite to each other.

A general laminated ceramic piezoelectric element in which piezoelectric ceramic materials are laminated is subjected to polarization processing after producing a laminate of the piezoelectric ceramic materials. Only common electrodes exist at the interface between the piezoelectric layers, so that the polarization directions of the piezoelectric layers alternate in the lamination direction.

Contrary to this, the piezoelectric films 10 constituting the laminated piezoelectric element of the embodiment of the present invention can be subjected to polarization processing in the state of the piezoelectric films 10 before lamination. The piezoelectric films 10 are preferably subjected to polarization processing of the piezoelectric layer 20 by corona poling processing before laminating the upper electrode 26 and the upper protective layer 30, as illustrated in FIGS. 4 and 5.

Therefore, the laminated piezoelectric element of the embodiment of the present invention can be produced by laminating the piezoelectric films 10 subjected to the polarization processing. Preferably, a long piezoelectric film (large-area piezoelectric film) subjected to the polarization processing is produced and cut into individual piezoelectric films 10, and then the piezoelectric films 10 are laminated to form the laminated piezoelectric element 14.

Figure 8:
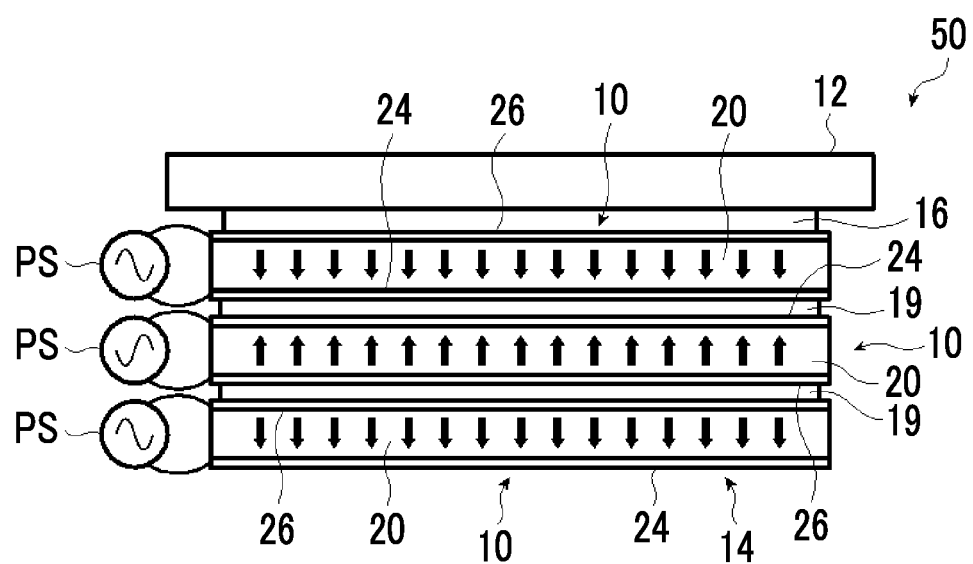
FIG. 8 is a conceptual diagram of an example of an electroacoustic transducer of the embodiment of the present invention using a laminated piezoelectric element of the embodiment of the present invention.
Figure 10:
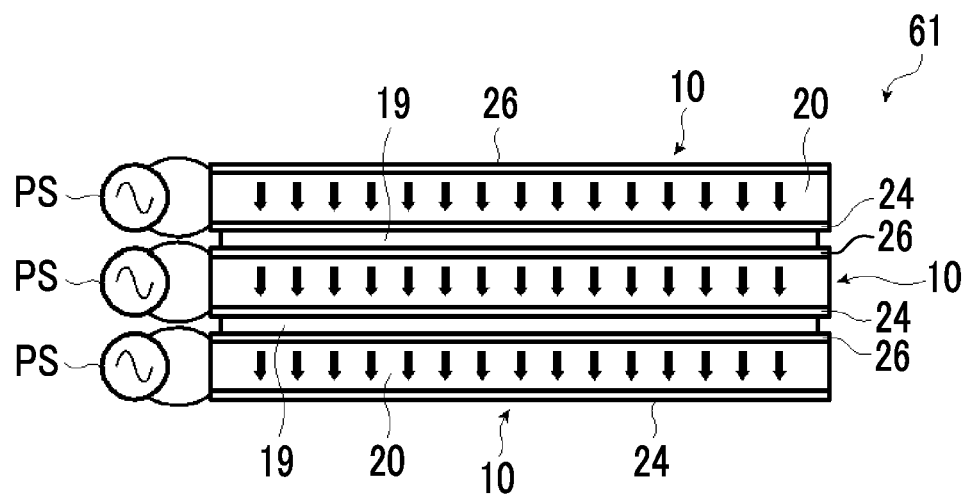
FIG. 10 is a conceptual diagram of another example of the laminated piezoelectric element of the embodiment of the present invention.

Therefore, in the laminated piezoelectric element of the embodiment of the present invention, the polarization directions of the piezoelectric films 10 adjacent to each other can be aligned in the lamination direction as in a laminated piezoelectric element 61 as illustrated in FIG. 10, or can be alternated as in the laminated piezoelectric element 14 illustrated in FIG. 8.

Here, it is known that in a case where a general piezoelectric film consisting of a polymer material such as PVDF is stretched in a uniaxial direction after being subjected to polarization processing, the molecular chains are oriented with respect to the stretching direction, and as a result, high piezoelectric properties are obtained in the stretching direction. Therefore, a general piezoelectric film has in-plane anisotropy in the piezoelectric properties, and has anisotropy in the amount of stretching and contracting in the surface direction in a case where a voltage is applied.

Contrary to this, the piezoelectric film 10 of the embodiment of the present invention consisting of the polymer-based piezoelectric composite material in which the piezoelectric particles 36 are dispersed in the matrix 34 achieves high piezoelectric properties without stretching after the polarization processing. Therefore, the piezoelectric film 10 of the embodiment of the present invention has no in-plane anisotropy in the piezoelectric properties, and stretches and contracts isotropically in all directions in an in-plane direction in a case where a driving voltage is applied as described later.

The piezoelectric film 10 of the embodiment of the present invention may be manufactured by using a cut sheet-shaped sheet-like material, but preferably roll-to-roll is used. In the following description, roll-to-roll is also referred to as "RtoR".

As is well known, RtoR is a manufacturing method of unwinding, from a roll around which a long raw material is wound, the raw material, performing various treatments such as film formation and surface treatments while transporting the raw material in the longitudinal direction, and winding again the treated raw material into a roll shape.

In a case where the piezoelectric film 10 is manufactured by the above-mentioned manufacturing method by RtoR, a first roll obtained by winding the sheet-like material 10a having the lower electrode 24 formed on the long lower protective layer 28, and a second roll obtained by winding the sheet-like material 10c having the upper electrode 26 formed on the long upper protective layer 30 are used.

The first roll and the second roll may be exactly the same.

The sheet-like material 10a is led out from this roll, and while transporting the sheet-like material 10a in the longitudinal direction, a coating material containing the viscoelastic material and the piezoelectric particles 36 is applied and dried by heating or the like to form the piezoelectric layer 20 on the lower electrode 24, whereby the laminate 10b described above is obtained.

Next, the above-mentioned corona poling is performed so that the piezoelectric layer 20 is subjected to the polarization processing. Here, in a case where the piezoelectric film 10 is manufactured by RtoR, the polarization processing of the piezoelectric layer 20 is performed by the corona poling by the rod-like long corona electrode 40 which is fixed in the direction perpendicular to the transport direction of the laminate 10b while transporting the laminate 10b. Before the polarization processing, calender processing may be performed as described above.

Next, the sheet-like material 10c is led out from the second roll, and while transporting the sheet-like material 10c and the laminate, the sheet-like material 10c is laminated on the laminate 10b with the upper electrode 26 facing the piezoelectric layer 20 as described above by a known method using a bonding roller or the like.

Thereafter, the laminate 10b and the sheet-like material 10c are interposed and transported between a pair of heating rollers to be subjected to thermal compression bonding to complete the piezoelectric film 10 of the embodiment of the present invention, and the piezoelectric film 10 is wound in a roll shape.

The production environment of the piezoelectric film 10 is usually considered to be room temperature. On the other hand, the piezoelectric film 10 of the embodiment of the present invention has not only good flexibility in a high temperature region as described above, but also sufficient flexibility even at room temperature. Therefore, the piezoelectric film 10 of the embodiment of the present invention can suitably cope with the manufacturing method including winding such as RtoR.

In the above example, the piezoelectric film 10 of the embodiment of the present invention is produced by transporting the sheet-like material (laminate) only once in the longitudinal direction by RtoR, but the present invention is not limited thereto.

For example, after forming the above-described laminate 10b and performing corona poling, the laminate is wound once into a roll shape to obtain a laminate roll. Next, the laminate is led out from the laminate roll, and while transporting the laminate in the longitudinal direction, the sheet-like material having the upper electrode 26 formed on the upper protective layer 30 is laminated as described above to complete the piezoelectric film 10. The piezoelectric film 10 may be wound into a roll shape.

In a case where a voltage is applied to the lower electrode 24 and the upper electrode 26 of the piezoelectric film 10, the piezoelectric particles 36 stretch and contract in the polarization direction according to the applied voltage. As a result, the piezoelectric film 10 (piezoelectric layer 20) contracts in the thickness direction. At the same time, the piezoelectric film 10 stretches and contracts in the in-plane direction due to the Poisson's ratio. The degree of stretching and contracting is about 0.01% to 0.1%. In the in-plane direction, the piezoelectric film 10 stretches and contracts isotropically in all directions as described above.

As described above, the thickness of the piezoelectric layer 20 is preferably about 10 to 300 μm. Therefore, the degree of stretching and contracting in the thickness direction is as very small as about 0.3 μm at the maximum.

Contrary to this, the piezoelectric film 10, that is, the piezoelectric layer 20, has a size much larger than the thickness in the surface direction. Therefore, for example, in a case where the length of the piezoelectric film 10 is 20 cm, the piezoelectric film 10 stretches and contracts by a maximum of about 0.2 mm by the application of a voltage.

Furthermore, in a case where a pressure is applied to the piezoelectric film 10, electric power is generated by the action of the piezoelectric particles 36.

By utilizing this, the piezoelectric film 10 can be used for various usages such as a speaker, a microphone, and a pressure-sensitive sensor, as described above.

Figure 7:
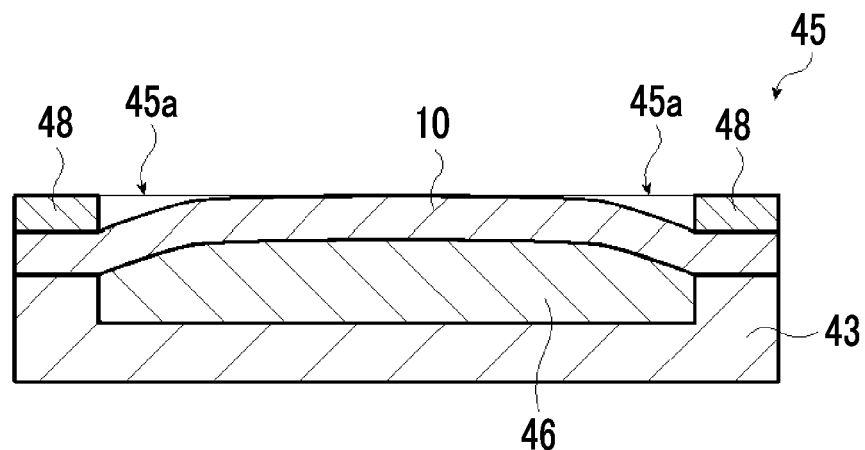
FIG. 7 is a conceptual diagram of an example of a piezoelectric speaker using the piezoelectric film illustrated in FIG. 1.

FIG. 7 illustrates a conceptual diagram of an example of a flat plate type piezoelectric speaker using the piezoelectric film 10 of the embodiment of the present invention.

The piezoelectric speaker 45 is a flat plate type piezoelectric speaker that uses the piezoelectric film 10 of the embodiment of the present invention as a vibration plate that converts an electrical signal into vibration energy. The piezoelectric speaker 45 can also be used as a microphone, a sensor, or the like.

The piezoelectric speaker 45 is configured to have the piezoelectric film 10, a case 43, a viscoelastic support 46, and a frame 48.

The case 43 is a thin regular square tubular housing formed of plastic or the like and having one side open.

The frame 48 is a plate material having a through-hole at the center and having the same shape as the upper end surface (opening surface side) of the case 43.

The viscoelastic support 46 has appropriate viscosity and elasticity. The viscoelastic support 46 supports the piezoelectric film 10 and applies a constant mechanical bias to any place of the piezoelectric film to efficiently convert the stretching and contracting movement of the piezoelectric film 10 into a forward and rearward movement (a movement in the direction perpendicular to the surface of the film). Examples of the viscoelastic support 46 include wool felt, nonwoven fabric such as wool felt containing rayon and PET, and glass wool.

The piezoelectric speaker 45 is configured by accommodating the viscoelastic support 46 in the case 43, covering the case 43 and the viscoelastic support 46 with the piezoelectric film 10, and fixing the frame 48 to the case 43 in a state of pressing the periphery of the piezoelectric film 10 against the upper end surface of the case 43 by the frame 48.

Here, in the piezoelectric speaker 45, the viscoelastic support 46 has a square columnar shape whose height (thickness) is larger than the height of the inner surface of the case 43.

Therefore, in the piezoelectric speaker 45, the viscoelastic support 46 is held in a state of being thinned by being pressed downward by the piezoelectric film 10 at the peripheral portion of the viscoelastic support 46. Similarly, in the peripheral portion of the viscoelastic support 46, the curvature of the piezoelectric film 10 suddenly fluctuates, and a rising portion 45a that decreases in height toward the periphery of the viscoelastic support 46 is formed in the piezoelectric film 10. Furthermore, the central region of the piezoelectric film 10 is pressed by the viscoelastic support 46 having a square columnar shape and has a (approximately) planar shape.

In the piezoelectric speaker 45, in a case where the piezoelectric film 10 is stretched in the in-plane direction due to the application of a driving voltage to the lower electrode 24 and the upper electrode 26, the rising portion 45a of the piezoelectric film 10 changes in angle in a rising direction due to the action of the viscoelastic support 46 in order to absorb the stretching. As a result, the piezoelectric film 10 having the planar portion moves upward.

Contrary to this, in a case where the piezoelectric film 10 contracts in the in-plane direction due to the application of the driving voltage to the lower electrode 24 and the upper electrode 26, the rising portion 45a of the piezoelectric film 10 changes in angle in a falling direction (a direction approaching the flat surface) in order to absorb the contracting. As a result, the piezoelectric film 10 having the planar portion moves downward.

The piezoelectric speaker 45 generates a sound by the vibration of the piezoelectric film 10.

In the piezoelectric film 10 of the embodiment of the present invention, the conversion from the stretching and contracting movement to vibration can also be achieved by holding the piezoelectric film 10 in a curved state.

Therefore, the piezoelectric film 10 of the embodiment of the present invention can function as a speaker having flexibility by being simply held in a curved state instead of the piezoelectric speaker 45.

FIG. 8 conceptually illustrates an example of the electroacoustic transducer of the embodiment of the present invention.

The electroacoustic transducer of the embodiment of the present invention has the laminated piezoelectric element or the piezoelectric film of the embodiment of the present invention and a vibration plate. In addition, the laminated piezoelectric element of the embodiment of the present invention is formed by laminating a plurality of layers of the piezoelectric films according to the embodiment of the present invention.

As described above, the piezoelectric film 10 of the embodiment of the present invention has excellent flexibility in a high temperature environment at higher than 50° C. and also has good flexibility even in a room temperature environment. Therefore, the laminated piezoelectric element of the embodiment of the present invention in which the piezoelectric films 10 are laminated also has excellent flexibility in a high temperature environment at higher than 50° C. and good flexibility even in a room temperature environment.

Furthermore, in the electroacoustic transducer of the embodiment of the present invention, it is preferable to use a vibration plate having flexibility as the vibration plate. By using the vibration plate having flexibility, the electroacoustic transducer of the embodiment of the present invention has excellent flexibility in a high temperature environment at higher than 50° C. due to the action and effect of the above-described laminated piezoelectric element and has good flexibility even in a room temperature environment.

An electroacoustic transducer 50 illustrated in FIG. 8 has the laminated piezoelectric element 14 and the vibration plate 12. The laminated piezoelectric element 14 is the laminated piezoelectric element of the embodiment of the present invention. The laminated piezoelectric element 14 of the illustrated example is a laminate of three layers of the above-described piezoelectric films 10 of the embodiment of the present invention.

In the electroacoustic transducer 50, the laminated piezoelectric element 14 and the vibration plate 12 are bonded to each other by a bonding layer 16.

Power sources PS for applying a driving voltage are connected to the piezoelectric films 10 included in the laminated piezoelectric element 14 of the electroacoustic transducer 50.

For simplification of the drawings, in FIG. 8, the lower protective layer 28 and the upper protective layer 30 are omitted. However, in the laminated piezoelectric element 14 illustrated in FIG. 8, as a preferable embodiment, all the piezoelectric films 10 have both the lower protective layer 28 and the upper protective layer 30.

However, the laminated piezoelectric element of the embodiment of the present invention is not limited thereto, and a piezoelectric film having the protective layer and a piezoelectric film not having the protective layer may be mixed. Furthermore, in a case where the piezoelectric film has the protective layer, the piezoelectric film may have only the lower protective layer 28 or only the upper protective layer 30. As an example, the laminated piezoelectric element 14 having a three-layer configuration as illustrated in FIG. 8 may have a configuration in which the piezoelectric film in the uppermost layer in the figure has only the upper protective layer 30, and the piezoelectric film in the middle has no protective layer, and the piezoelectric film in the lowermost layer has only the lower protective layer 28.

In this regard, the same applies to the laminated piezoelectric element 56 illustrated in FIG. 9 and the laminated piezoelectric element 61 illustrated in FIG. 10, which will be described later.

As will be described in detail later, in the electroacoustic transducer 50, as the driving voltage is applied to the piezoelectric film 10 of the laminated piezoelectric element 14, the piezoelectric film 10 stretches and contracts in the surface direction, and by the stretching and contracting of the piezoelectric film 10, the laminated piezoelectric element 14 stretches and contracts in the surface direction.

The stretching and contracting of the laminated piezoelectric element 14 in the surface direction causes the vibration plate 12 to bend, and as a result, the vibration plate 12 vibrates in the thickness direction. The vibration plate 12 generates a sound due to the vibration in the thickness direction. That is, the vibration plate 12 vibrates according to the magnitude of the driving voltage applied to the piezoelectric film 10, and generates a sound according to the driving voltage applied to the piezoelectric film 10.

That is, the electroacoustic transducer 50 is a speaker that uses the laminated piezoelectric element 14 of the embodiment of the present invention as an exciter.

In the electroacoustic transducer 50 of the embodiment of the present invention, the vibration plate 12 has flexibility as a preferable embodiment. In the present invention, having flexibility is synonymous with having flexibility in a general interpretation, and indicates being capable of bending and being flexible, specifically, being capable of bending and stretching without causing breakage and damage.

The vibration plate 12 is not limited as long as the vibration plate 12 preferably has flexibility and satisfies the relationship with the laminated piezoelectric element 14 described later, and various sheet-like materials (plate-like materials or films) can be used.

Examples of the vibration plate 12 include resin films made of polyethylene terephthalate (PET), polypropylene (PP), polystyrene (PS), polycarbonate (PC), polyphenylene sulfide (PPS), polymethylmethacrylate (PMMA), and polyetherimide (PEI), polyimide (PI), polyethylene naphthalate (PEN), triacetyl cellulose (TAC), cyclic olefin-based resins, or the like, foamed plastic made of expanded polystyrene, expanded styrene, expanded polyethylene, or the like, veneer boards, cork boards, leathers such as cowhide, various kinds of paperboards such as carbon sheets and Japanese paper, and various kinds of corrugated cardboard materials obtained by bonding, to one or both surfaces of a corrugated paperboard, other paperboards.

Furthermore, in the electroacoustic transducer 50 of the embodiment of the present invention, as the vibration plate 12, a display device such as an organic electroluminescence (organic light emitting diode (OLED)) display, a liquid crystal display, a micro light emitting diode (LED) display, and an inorganic electroluminescence display, a screen for a projector, and the like can be suitably used as long as they have flexibility.

In the electroacoustic transducer 50 of the illustrated example, as a preferable embodiment, the vibration plate 12 and the laminated piezoelectric element 14 are bonded to each other by the bonding layer 16.

In the present invention, various known bonding layers 16 can be used as long as the vibration plate 12 and the laminated piezoelectric element 14 can be bonded to each other.

Therefore, the bonding layer 16 may be a layer consisting of an adhesive, which has fluidity during bonding and thereafter becomes a solid, a layer consisting of a pressure sensitive adhesive, which is a gel-like (rubber-like) flexible solid during bonding and does not change in the gel-like state thereafter, or a layer consisting of a material having characteristics of both an adhesive and a pressure sensitive adhesive. Furthermore, the bonding layer 16 may be formed by applying a bonding agent having fluidity such as a liquid, or may be formed by using a sheet-shaped bonding agent.

Here, in the electroacoustic transducer 50 of the embodiment of the present invention, the laminated piezoelectric element 14 is stretched and contracted to bend and vibrate the vibration plate 12 to generate a sound. Therefore, in the electroacoustic transducer 50 of the embodiment of the present invention, it is preferable that the stretching and contracting of the laminated piezoelectric element 14 is directly transmitted to the vibration plate 12. In a case where a substance having a viscosity that relieves vibration is present between the vibration plate 12 and the laminated piezoelectric element 14, the efficiency of transmitting the stretching and contracting energy of the laminated piezoelectric element 14 to the vibration plate 12 is lowered, and the driving efficiency of the electroacoustic transducer 50 is also decreased.

In consideration of this point, the bonding layer 16 is preferably an adhesive layer consisting of an adhesive with which a solid and hard bonding layer 16 is obtained, rather than a pressure sensitive adhesive layer consisting of a pressure sensitive adhesive. As a more preferable bonding layer 16, specifically, a bonding layer consisting of a thermoplastic type adhesive such as a polyester-based adhesive or a styrene-butadiene rubber (SBR)-based adhesive is exemplified.

Adhesion, unlike pressure sensitive adhesion, is useful in a case where a high adhesion temperature is required. Furthermore, the thermoplastic type adhesive has "relatively low temperature, short time, and strong adhesion" and is suitable.

The thickness of the bonding layer 16 is not limited, and a thickness at which sufficient bonding force (adhesive force or pressure sensitive adhesive force) can be obtained may be appropriately set depending on the material of the bonding layer 16.

Here, in the electroacoustic transducer 50 of the embodiment of the present invention, the thinner the bonding layer 16, the higher the effect of transmitting the stretching and contracting energy (vibration energy) of the laminated piezoelectric element 14 transmitted to the vibration plate 12, and the higher the energy efficiency. In addition, in a case where the bonding layer 16 is thick and has high rigidity, there is also a possibility that the stretching and contracting of the laminated piezoelectric element 14 may be constrained.

In consideration of this point, the bonding layer 16 is preferably thin. Specifically, the thickness of the bonding layer 16 is preferably 0.1 to 50 µm, more preferably 0.1 to 30 µm, and even more preferably 0.1 to 10 µm in terms of thickness after bonding.

In the electroacoustic transducer 50, the bonding layer 16 is provided as a preferable embodiment and is not an essential constituent element.

Therefore, the electroacoustic transducer 50 does not have to have the bonding layer 16, and the vibration plate 12 and the laminated piezoelectric element 14 may be fixed to each other by using a known pressure bonding unit, a fastening unit, a fixing unit, or the like. For example, in a case where the laminated piezoelectric element 14 is rectangular, the electroacoustic transducer may be configured by fastening four corners with members such as bolts and nuts, or the electroacoustic transducer may be configured by fastening the four corners to a center portion with the same members.

However, in this case, in a case where the driving voltage is applied from the power source PS, the laminated piezoelectric element 14 stretches and contracts independently of the vibration plate 12, and in some cases, only the laminated piezoelectric element 14 bends, which results in that the stretching and contracting of the laminated piezoelectric element 14 is not transmitted to the vibration plate 12. As described above, in a case where the laminated piezoelectric element 14 stretches and contracts independently of the vibration plate 12, the vibration efficiency of the vibration plate 12 by the laminated piezoelectric element 14 decreases, there is a possibility that the vibration plate 12 may not be sufficiently vibrated.

In consideration of this point, in the electroacoustic transducer of the embodiment of the present invention, it is preferable that the vibration plate 12 and the laminated piezoelectric element 14 are bonded to each other by the bonding layer 16 as in the illustrated example.

In the electroacoustic transducer 50 illustrated in FIG. 8, the laminated piezoelectric element 14 has a configuration in which three piezoelectric films 10 are laminated and the adjacent piezoelectric films 10 are bonded to each other by the bonding layer 19. The power sources PS for applying a driving voltage for stretching and contracting the piezoelectric films 10 are respectively connected to the piezoelectric films 10.

The laminated piezoelectric element 14 illustrated in FIG. 8 is formed by laminating three piezoelectric films 10, but the present invention is not limited thereto. That is, the number of laminated piezoelectric films 10 may be two layers or four or more layers as long as the laminated piezoelectric element of the present invention is formed by laminating a plurality of layers of the piezoelectric films 10. In this regard, the same applies to the laminated piezoelectric element 56 illustrated in FIG. 9 and the laminated piezoelectric element 61 illustrated in FIG. 10, which will be described later.

In addition, the electroacoustic transducer of the embodiment of the present invention may generate a sound by vibrating the vibration plate 12 with the same action and effect by the piezoelectric film of the embodiment of the present invention instead of the laminated piezoelectric element 14 of the embodiment of the present invention. That is, the electroacoustic transducer of the present invention may use the piezoelectric film of the present invention as an exciter.

As a preferable embodiment, the laminated piezoelectric element 14 illustrated in FIG. 8 has a configuration in which a plurality of layers (three layers in the illustrated example) of the piezoelectric films 10 are laminated so that the polarization directions of the piezoelectric films 10 adjacent to each other are opposite to each other, and the adjacent piezoelectric films 10 are bonded by the bonding layer 19.

In the present invention, as the bonding layer 19, various known bonding layers can be used as long as the adjacent piezoelectric films 10 can be bonded.

Therefore, the bonding layer 19 may be a layer consisting of an adhesive, a layer consisting of a pressure sensitive adhesive, or a layer consisting of a material having characteristics of both an adhesive and a pressure sensitive adhesive, which are described above. In addition, the bonding layer 19 may be formed by applying a bonding agent having fluidity such as a liquid, or may be formed by using a sheet-shaped bonding agent.

Here, the laminated piezoelectric element 14 vibrates the vibration plate 12 and generates a sound by stretching and contracting the plurality of laminated piezoelectric films 10. Therefore, in the laminated piezoelectric element 14, it is preferable that the stretching and contracting of each piezoelectric film 10 is directly transmitted. In a case where a substance having a viscosity that relieves vibration is present between the piezoelectric films 10, the efficiency of transmitting the stretching and contracting energy of the piezoelectric film 10 is lowered, and the driving efficiency of the laminated piezoelectric element 14 is also decreased.

In consideration of this point, the bonding layer 19 is preferably an adhesive layer consisting of an adhesive with which a solid and hard bonding layer 19 is obtained, rather than a pressure sensitive adhesive layer consisting of a pressure sensitive adhesive. As a more preferable bonding layer 19, specifically, a bonding layer consisting of a thermoplastic type adhesive such as a polyester-based adhesive or a styrene-butadiene rubber (SBR)-based adhesive is suitably exemplified.

Adhesion, unlike pressure sensitive adhesion, is useful in a case where a high adhesion temperature is required. Furthermore, the thermoplastic type adhesive has "relatively low temperature, short time, and strong adhesion" and is suitable.

In the laminated piezoelectric element 14, the thickness of the bonding layer 19 is not limited, and a thickness capable of exhibiting sufficient bonding force may be appropriately set depending on the forming material of the bonding layer 19.

Here, in the laminated piezoelectric element 14 of the illustrated example, the thinner the bonding layer 19, the higher the effect of transmitting the stretching and contracting energy of the piezoelectric film 10, and the higher the energy efficiency. In addition, in a case where the bonding layer 19 is thick and has high rigidity, there is also a possibility that the stretching and contracting of the piezoelectric film 10 may be constrained.

In consideration of this point, the bonding layer 19 is preferably thinner than the piezoelectric layer 20. That is, in the laminated piezoelectric element 14, the bonding layer 19 is preferably hard and thin. Specifically, the thickness of the bonding layer 19 is preferably 0.1 to 50 µm, more preferably 0.1 to 30 µm, and even more preferably 0.1 to 10 µm in terms of thickness after bonding.

Furthermore, as will be described later, in the laminated piezoelectric element 14 of the illustrated example, since the polarization directions of the adjacent piezoelectric films are opposite to each other and there is no concern that the adjacent piezoelectric films 10 may be short-circuited, the bonding layer 19 can be made thin.

In the laminated piezoelectric element 14 of the illustrated example, in a case where the spring constant (thickness× Young's modulus) of the bonding layer 19 is high, there is a possibility that the stretching and contracting of the piezoelectric film 10 may be constrained. Therefore, the spring constant of the bonding layer 19 is preferably less than or equal to the spring constant of the piezoelectric film 10.

Specifically, the product of the thickness of the bonding layer 19 and the storage elastic modulus (E') at a frequency of 1 Hz according to the dynamic viscoelasticity measurement is preferably less than or equal to $2.0 \times 10^6$ N/m at 0° C. and less than or equal to $1.0 \times 10^6$ N/m at 50° C.

It is preferable that the internal loss of the bonding layer at a frequency of 1 Hz according to the dynamic viscoelasticity measurement is less than or equal to 1.0 at 25° C. in the case of the bonding layer 19 consisting of a pressure sensitive adhesive, and is less than or equal to 0.1 at 25° C. in the case of the bonding layer 19 consisting of an adhesive.

In the laminated piezoelectric element 14 included in the electroacoustic transducer 50, the bonding layer 19 is provided as a preferable embodiment and is not an essential constituent element.

Therefore, in the laminated piezoelectric element included in the electroacoustic transducer of the embodiment of the present invention, the laminated piezoelectric element may be configured by laminating and closely attaching the piezoelectric films 10 using a known pressure bonding unit, a fastening unit, a fixing unit, or the like without having the bonding layer 19. For example, in a case where the piezoelectric film 10 is rectangular, the laminated piezoelectric element may be configured by fastening four corners with bolts, nuts, and the like or the laminated piezoelectric element may be configured by fastening four corners to a center portion with bolts, nuts, and the like. Alternatively, the laminated piezoelectric element may be configured by laminating the piezoelectric films 10 and thereafter bonding the peripheral portion (end surface) with a pressure sensitive adhesive tape to fix the laminated piezoelectric films 10.

However, in this case, in a case where a driving voltage is applied from the power source PS, the individual piezoelectric films 10 stretch and contract independently, and in some cases, layers of the piezoelectric films 10 bend in opposite directions and form a void. As described above, in a case where the individual piezoelectric films 10 stretch and contract independently, the driving efficiency of the laminated piezoelectric element decreases, the degree of stretching and contracting of the laminated piezoelectric element as a whole decreases, and there is a possibility that an abutting vibration plate or the like cannot sufficiently vibrate. In particular, in a case where the layers of the piezoelectric films 10 bend in the opposite directions and form a void, the driving efficiency of the laminated piezoelectric element is greatly decreased.

In consideration of this point, it is preferable that the laminated piezoelectric element of the embodiment of the present invention has the bonding layer 19 for bonding adjacent piezoelectric films 10 to each other, as in the laminated piezoelectric element 14 of the illustrated example.

As illustrated in FIG. 8, in the electroacoustic transducer 50, the power source PS for applying the driving voltage for stretching and contracting the piezoelectric film 10, that is, for supplying driving power, is connected to the lower electrode 24 and the upper electrode 26 of each of the piezoelectric films 10.

The power source PS is not limited and may be a direct-current power source or an alternating-current power source. In addition, as for the driving voltage, a driving voltage capable of appropriately driving each of the piezoelectric films 10 may be appropriately set according to the thickness, forming material, and the like of the piezoelectric layer 20 of each piezoelectric film 10.

As will be described later, in the laminated piezoelectric element 14 of the illustrated example, the polarization directions of the adjacent piezoelectric films 10 are opposite. Therefore, in the adjacent piezoelectric films 10, the lower electrodes 24 face each other and the upper electrodes 26 face each other. Therefore, the power source PS always supplies power of the same polarity to the facing electrodes regardless of whether the power source PS is an alternating-current power source or a direct-current power source. For example, in the laminated piezoelectric element 14 illustrated in FIG. 8, the upper electrode 26 of the piezoelectric film 10 in the lowermost layer in the figure and the upper electrode 26 of the piezoelectric film 10 in the second layer (middle layer) are always supplied with power of the same polarity, and the lower electrode 24 of the piezoelectric film 10 in the second layer and the lower electrode 24 of the piezoelectric film 10 in the uppermost layer in the figure are always supplied with power of the same polarity.

A method of leading out an electrode from the lower electrode 24 and the upper electrode 26 is not limited, and various known methods can be used.

As an example, a method of leading out an electrode to the outside by connecting a conductor such as a copper foil to the lower electrode 24 and the upper electrode 26, and a method of leading out an electrode to the outside by forming through-holes in the lower protective layer 28 and the upper protective layer 30 by a laser or the like and filling the through-holes with a conductive material are exemplified.

As a suitable method of leading out an electrode, the method described in JP2014-209724A, the method described in JP2016-015354A, and the like are exemplified.

As described above, the piezoelectric layer 20 is formed by dispersing the piezoelectric particles 36 in the matrix 34. In addition, the lower electrode 24 and the upper electrode 26 are provided so as to sandwich the piezoelectric layer 20 therebetween in the thickness direction.

In a case where a voltage is applied to the lower electrode 24 and the upper electrode 26 of the piezoelectric film 10 having the piezoelectric layer 20, the piezoelectric particles 36 stretch and contract in the polarization direction according to the applied voltage. As a result, the piezoelectric film 10 (piezoelectric layer 20) contracts in the thickness direction. At the same time, the piezoelectric film 10 stretches and contracts in the in-plane direction due to the Poisson's ratio.

The degree of stretching and contracting is about 0.01% to 0.1%. As described above, the thickness of the piezoelectric layer 20 is preferably about 10 to 300 μm. Therefore, the degree of stretching and contracting in the thickness direction is as very small as about 0.3 μm at the maximum.

Contrary to this, the piezoelectric film 10, that is, the piezoelectric layer 20, has a size much larger than the thickness in the surface direction. Therefore, for example, in a case where the length of the piezoelectric film 10 is 20 cm, the piezoelectric film 10 stretches and contracts by a maximum of about 0.2 mm by the application of a voltage.

The laminated piezoelectric element 14 is formed by laminating and bonding the piezoelectric films 10. Therefore, in a case where the piezoelectric film 10 stretches and contracts, the laminated piezoelectric element 14 also stretches and contracts.

The vibration plate 12 is bonded to the laminated piezoelectric element 14 by the bonding layer 16. Therefore, the stretching and contracting of the laminated piezoelectric element 14 causes the vibration plate 12 to bend, and as a result, the vibration plate 12 vibrates in the thickness direction.

The vibration plate 12 generates a sound due to the vibration in the thickness direction. That is, the vibration plate 12 vibrates according to the magnitude of the voltage (driving voltage) applied to the piezoelectric film 10, and generates a sound according to the driving voltage applied to the piezoelectric film 10.

As described above, a general piezoelectric film consisting of a polymer material such as PVDF has in-plane anisotropy in the piezoelectric properties, and has anisotropy in the amount of stretching and contracting in the surface direction in a case where a voltage is applied.

Contrary to this, in the electroacoustic transducer 50 of the illustrated example, the piezoelectric film 10 of the embodiment of the present invention included in the laminated piezoelectric element 14 has no in-plane anisotropy in the piezoelectric properties and stretches and contracts isotropically in all directions in the in-plane direction. That is, in the electroacoustic transducer 50 of the illustrated example, the piezoelectric film 10 included in the laminated piezoelectric element 14 stretches and contracts isotropically and two-dimensionally.

According to the laminated piezoelectric element 14 in which such piezoelectric films 10 that stretch and contract isotropically and two-dimensionally are laminated, compared to a case where general piezoelectric films made of PVDF or the like that stretch and contract greatly in only one direction are laminated, the vibration plate 12 can be vibrated with a large force, and a louder and more beautiful sound can be generated.

The laminated piezoelectric element 14 of the illustrated example is a laminate of a plurality of the piezoelectric films 10. In the laminated piezoelectric element 14 of the illustrated example, as a preferable embodiment, the piezoelectric films 10 adjacent to each other are further bonded by the bonding layer 19.

Therefore, even though the rigidity of each piezoelectric film 10 is low and the stretching and contracting force thereof is small, the rigidity is increased by laminating the piezoelectric films 10, and the stretching and contracting force as the laminated piezoelectric element 14 is increased. As a result, in the laminated piezoelectric element 14, even in a case where the vibration plate 12 has a certain degree of rigidity, the vibration plate 12 is sufficiently bent with a large force and the vibration plate 12 can be sufficiently vibrated in the thickness direction, whereby the vibration plate 12 can generate a sound.

In addition, the thicker the piezoelectric layer 20, the larger the stretching and contracting force of the piezoelectric film 10, but the larger the driving voltage required for stretching and contracting by the same amount. Here, as described above, in the laminated piezoelectric element 14, a preferable thickness of the piezoelectric layer 20 is about 300 μm at the maximum. Therefore, even in a case where the voltage applied to each piezoelectric film 10 is small, it is possible to sufficiently stretch and contract the piezoelectric films 10.

In the electroacoustic transducer 50 of the embodiment of the present invention, it is preferable that the product of the thickness of the laminated piezoelectric element 14 and the storage elastic modulus of the laminated piezoelectric element 14 at a frequency of 1 Hz and 25° C. according to the dynamic viscoelasticity measurement is 0.1 to 3 times the product of the thickness of the vibration plate 12 and the Young's modulus.

As described above, the piezoelectric film 10 of the embodiment of the present invention has good flexibility, particularly excellent flexibility in a high temperature environment at higher than 50° C., and the laminated piezoelectric element 14 of the embodiment of the present invention in which the piezoelectric films 10 are laminated also has good flexibility, particularly excellent flexibility in a high temperature environment at higher than 50° C.

On the other hand, the vibration plate 12 has a certain degree of rigidity. In a case where the laminated piezoelectric element 14 having rigidity is combined with the vibration plate 12, the combination becomes hard and difficult to bent, which is disadvantageous in terms of flexibility of the electroacoustic transducer 50.

On the other hand, in the electroacoustic transducer 50 of the embodiment of the present invention, the product of the thickness of the laminated piezoelectric element 14 and the storage elastic modulus at a frequency of 1 Hz and 25° C. according to the dynamic viscoelasticity measurement is preferably at most three times the product of the thickness of the vibration plate 12 and the Young's modulus. That is, in the laminated piezoelectric element 14, the spring constant with respect to a slow movement is preferably at most three times that of the vibration plate 12.

With this configuration, the electroacoustic transducer 50 of the embodiment of the present invention can be flexible with respect to a slow movement due to an external force such as bending and rolling, that is, exhibits good flexibility with respect to a slow movement.

In the electroacoustic transducer 50 of the embodiment of the present invention, the product of the thickness of the laminated piezoelectric element 14 and the storage elastic modulus at a frequency of 1 Hz and 25° C. according to the dynamic viscoelasticity measurement is more preferably at most two times, even more preferably at most one time, and particularly preferably at most 0.3 times the product of the thickness of the vibration plate 12 and the Young's modulus.

In consideration of the material used for the laminated piezoelectric element 14, a preferable configuration of the laminated piezoelectric element 14, and the like, the product of the thickness of the laminated piezoelectric element 14 and the storage elastic modulus at a frequency of 1 Hz and 25° C. according to the dynamic viscoelasticity measurement is preferably at least 0.1 times the product of the thickness of the vibration plate 12 and the Young's modulus.

In the electroacoustic transducer 50 of the embodiment of the present invention, the product of the thickness of the laminated piezoelectric element 14 and the storage elastic modulus of the laminated piezoelectric element 14 at a frequency of 1 kHz and 25° C. in the master curve obtained from the dynamic viscoelasticity measurement is preferably 0.3 to 10 times the product of the thickness of the vibration plate 12 and the Young's modulus. That is, in the laminated piezoelectric element 14, the spring constant for a fast movement in a driven state is preferably 0.3 to 10 times that of the vibration plate 12.

As described above, the electroacoustic transducer 50 generates a sound by vibrating the vibration plate 12 by the stretching and contracting of the laminated piezoelectric element 14 in the surface direction. Therefore, the laminated piezoelectric element 14 preferably has a certain degree of rigidity (hardness, stiffness) with respect to the vibration plate 12 at a frequency of the audio band (20 Hz to 20 kHz).

In the electroacoustic transducer 50 of the embodiment of the present invention, the product of the thickness of the laminated piezoelectric element 14 and the storage elastic modulus at a frequency of 1 kHz and 25° C. in the master curve obtained from the dynamic viscoelasticity measurement is set to preferably at least 0.3 times, more preferably at least 0.5 times, and even more preferably at least 1 time the product of the thickness of the vibration plate 12 and the Young's modulus. That is, in the laminated piezoelectric element 14, the spring constant with respect to a fast movement is preferably at least 0.3 times, more preferably at least 0.5 times, and even more preferably at least 1 time that of the vibration plate 12.

Accordingly, at a frequency of the audio band, the rigidity of the laminated piezoelectric element 14 with respect to the vibration plate 12 is sufficiently secured, and the electroacoustic transducer 50 can output a sound with high sound pressure with high energy efficiency.

On the other hand, in consideration of the materials available for the laminated piezoelectric element 14, a preferable configuration of the laminated piezoelectric element 14, and the like, the product of the thickness of the laminated piezoelectric element 14 and the storage elastic modulus at a frequency of 1 kHz and 25° C. according to the dynamic viscoelasticity measurement is preferably at most 10 times the product of the thickness of the vibration plate 12 and the Young's modulus.

As is clear from the above description, the product of the thickness of the laminated piezoelectric element 14 and the storage elastic modulus at a frequency of 1 Hz and 25° C. according to the dynamic viscoelasticity measurement is greatly affected by not only the thickness of the bonding layer 19 but also the physical properties of the bonding layer 19 such as the storage elastic modulus.

On the other hand, the product of the thickness of the vibration plate 12 and the Young's modulus, that is, the spring constant of the vibration plate is greatly affected by not only the thickness of the vibration plate but also the physical properties of the vibration plate.

Therefore, in the electroacoustic transducer 50 of the embodiment the present invention, in order to satisfy the condition that the product of the thickness of the laminated piezoelectric element 14 and the storage elastic modulus of the laminated piezoelectric element 14 at a frequency of 1 Hz and 25° C. according to the dynamic viscoelasticity measurement is 0.1 to 3 times the product of the thickness of the vibration plate 12 and the Young's modulus, the thickness and material of the bonding layer 19 and the thickness and material of the vibration plate are important. In addition, in the electroacoustic transducer 50 of the embodiment of the present invention, in order to also satisfy the condition that the product of the thickness of the laminated piezoelectric element 14 and the storage elastic modulus of the laminated piezoelectric element 14 at a frequency of 1 kHz and 25° C. is 0.3 to 10 times the product of the thickness of the vibration plate 12 and the Young's modulus, the thickness and material of the bonding layer 19 and the thickness and material of the vibration plate are important.

That is, in the electroacoustic transducer 50 of the embodiment of the present invention, it is preferable to appropriately select the thickness and material of the bonding layer 19 and the thickness and material of the vibration plate 12 so as to satisfy the above conditions.

In other words, in the electroacoustic transducer 50 of the embodiment of the present invention, by appropriately selecting the thickness and material of the bonding layer 19 and the thickness and material of the vibration plate 12 according to the properties of the piezoelectric film 10 and the like, it is possible to appropriately satisfy the condition that the product of the thickness of the laminated piezoelectric element 14 and the storage elastic modulus of the laminated piezoelectric element 14 at a frequency of 1 Hz and 25° C. according to the dynamic viscoelasticity measurement is 0.1 to 3 times the product of the thickness of the vibration plate 12 and the Young's modulus, and/or the condition that the product of the thickness of the laminated piezoelectric element 14 and the storage elastic modulus of the laminated piezoelectric element 14 at a frequency of 1 kHz and 25° C. is 0.3 to 10 times the product of the thickness of the vibration plate 12 and the Young's modulus.

The product of the thickness and the storage elastic modulus described above is applied in the same manner even in a case where the electroacoustic transducer is configured by using the piezoelectric film 10 instead of the laminated piezoelectric element 14.

In the electroacoustic transducer 50 of the illustrated example, as a preferable embodiment, as described above, in the laminated piezoelectric element 14, the polarization directions of the piezoelectric layers 20 of the adjacent piezoelectric films 10 are opposite to each other.

In the piezoelectric film 10, the polarity of the voltage applied to the piezoelectric layer 20 depends on the polarization direction. Therefore, regarding the polarity of the applied voltage, in the polarization directions indicated by the arrows in FIG. 8, the polarity of the electrode on the side in a direction in which the arrows are directed (the downstream side of the arrows) and the polarity of the electrode on the opposite side (the upstream side of the arrows) are coincident with each other in all the piezoelectric films 10.

In the illustrated example, the electrode on the side in the direction in which the arrows indicating the polarization direction are directed is the lower electrode 24, the electrode on the opposite side is the upper electrode 26, and the polarities of the upper electrode 26 and the lower electrode 24 are the same in all the piezoelectric films 10.

Therefore, in the laminated piezoelectric element 14 in which the polarization directions of the piezoelectric layers 20 of the adjacent piezoelectric films 10 are opposite to each other, in the adjacent piezoelectric films 10, the upper electrodes 26 face each other on one surface, and the lower electrodes face each other on the other surface. Therefore, in the laminated piezoelectric element 14, even in a case where the electrodes of the adjacent piezoelectric films 10 come into contact with each other, there is no risk of a short circuit.

As described above, in order to stretch and contract the laminated piezoelectric element 14 with good energy efficiency, it is preferable to make the bonding layer 19 thin so that the bonding layer 19 does not interfere with the stretching and contracting of the piezoelectric layer 20.

Contrary to this, in the laminated piezoelectric element 14 of the illustrated example in which there is no risk of a short circuit even in a case where the electrodes of the adjacent piezoelectric films 10 come into contact with each other, the bonding layer 19 may be omitted. In addition, even in a case where the bonding layer 19 is provided as a preferable embodiment, the bonding layer 19 can be made extremely thin as long as a required bonding force can be obtained.

Therefore, the laminated piezoelectric element 14 can be stretched and contracted with high energy efficiency.

As described above, in the piezoelectric film 10, the absolute amount of stretching and contracting of the piezoelectric layer 20 in the thickness direction is very small, and the stretching and contracting of the piezoelectric film 10 is substantially only in the surface direction.

Therefore, even in a case where the polarization directions of the laminated piezoelectric films 10 are opposite to each other, all the piezoelectric films 10 stretch and contract in the same direction as long as the polarities of the voltages applied to the lower electrode 24 and the upper electrode 26 are correct.

In the laminated piezoelectric element 14, the polarization direction of the piezoelectric film 10 may be detected by a d33 meter or the like.

Alternatively, the polarization direction of the piezoelectric film 10 may be known from the processing conditions of the corona poling processing described above.

In the laminated piezoelectric element 14 of the illustrated example, preferably, as described above, a long (large-area) piezoelectric film is produced, and the long piezoelectric film is cut into individual piezoelectric films 10. Therefore, in this case, the plurality of piezoelectric films 10 constituting the laminated piezoelectric element 14 are all the same.

However, the present invention is not limited thereto. That is, in the electroacoustic transducer of the embodiment of the present invention, the laminated piezoelectric element can use various configuration such as a configuration in which piezoelectric films having different layer configurations, such as the piezoelectric film having the lower protective layer 28 and the upper protective layer 30 and a piezoelectric film having no lower protective layer and no upper protective layer, are laminated, a configuration in which piezoelectric films in which the thicknesses of the piezoelectric layers 20 are different are laminated, and the like.

In the electroacoustic transducer 50 illustrated in FIG. 8, the laminated piezoelectric element 14 is formed by laminating a plurality of piezoelectric films 10 so that the polarization directions of the piezoelectric films adjacent to each other are opposite to each other, and bonding the adjacent piezoelectric films 10 by the bonding layer 19, as a preferable embodiment.

The laminated piezoelectric element of the embodiment of the present invention is not limited thereto, and various configurations can be used.

Figure 9:
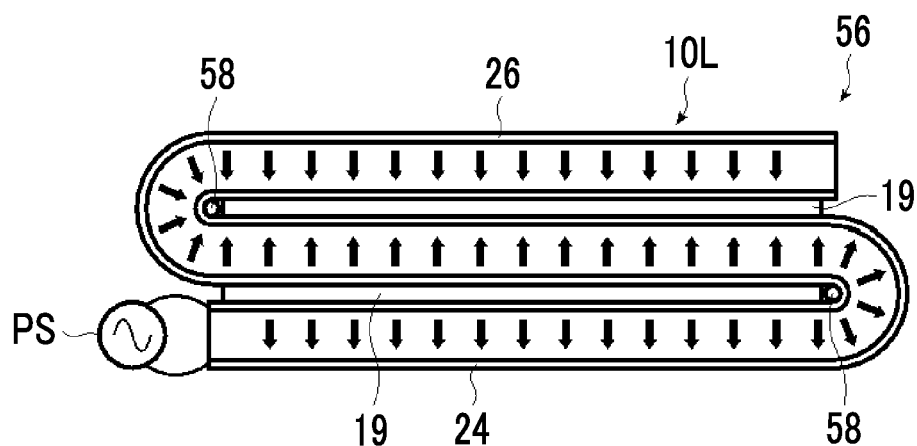
FIG. 9 is a conceptual diagram of another example of the laminated piezoelectric element of the embodiment of the present invention.

FIG. 9 illustrates an example thereof. Since the laminated piezoelectric element 56 illustrated in FIG. 9 uses a plurality of the same members of the above-mentioned laminated piezoelectric element 14, the same members are designated by the same reference numerals, and the description will be given mainly to different parts.

The laminated piezoelectric element 56 illustrated in FIG. 9 is a more preferable embodiment of the laminated piezoelectric element of the embodiment of the present invention, a long piezoelectric film 10L is folded back, for example, once or more, or preferably a plurality of times in the longitudinal direction, such that a plurality of layers of the piezoelectric film 10L are laminated. In addition, similarly to the laminated piezoelectric element 14 illustrated in FIG. 8 and the like described above, in the laminated piezoelectric element 56 illustrated in FIG. 9, as a preferable embodiment, the piezoelectric film 10L laminated by folding-back is bonded by the bonding layer 19.

By folding back and laminating one sheet of the long piezoelectric film 10L polarized in the thickness direction, the polarization directions of the piezoelectric film 10L adjacent (facing) in the lamination direction become opposite directions as indicated by the arrows in FIG. 9. The folding-back of the piezoelectric film may be in a lateral direction instead of the longitudinal direction.

According to this configuration, the laminated piezoelectric element 56 can be configured with only one long piezoelectric film 10L, only one power source PS for applying the driving voltage is required, and an electrode may be led out from the piezoelectric film 10L at one place.

Therefore, according to the laminated piezoelectric element 56 illustrated in FIG. 9, the number of components can be reduced, the configuration can be simplified, the reliability of the piezoelectric element (module) can be improved, and a further reduction in cost can be achieved.

Like the laminated piezoelectric element 56 illustrated in FIG. 9, in the laminated piezoelectric element 56 in which the piezoelectric film 10L is folded back, it is preferable to insert a core rod 58 into the folded-back portion of the piezoelectric film 10L while abutting the piezoelectric film 10L.

As described above, the lower electrode 24 and the upper electrode 26 of the piezoelectric film 10L are formed of a metal vapor deposition film or the like. In a case where the metal vapor deposition film is bent at an acute angle, cracks and the like are likely to occur, and there is a possibility that the electrode may be broken. That is, in the laminated piezoelectric element 56 illustrated in FIG. 9, cracks or the like are likely to occur in the electrodes inside the bent portion.

For this, in the laminated piezoelectric element 56 in which the long piezoelectric film 10L is folded back, by inserting the core rod 58 into the folded-back portion of the piezoelectric film 10L, the lower electrode 24 and the upper electrode 26 are prevented from being bent. Therefore, it is possible to preferably prevent the occurrence of breakage.

In the electroacoustic transducer of the embodiment of the present invention, the laminated piezoelectric element may use the bonding layer 19 having conductivity. In particular, in the laminated piezoelectric element 56 in which one sheet of the long piezoelectric film 10L is folded back and laminated as illustrated in FIG. 9, the bonding layer 19 having conductivity is preferably used.

In the laminated piezoelectric element in which the polarization directions of the adjacent piezoelectric film 10 are opposite to each other as illustrated in FIGS. 8 and 9, in the laminated piezoelectric film 10, electric power having the same polarity is supplied to the facing electrodes. Therefore, a short circuit does not occur between the facing electrodes.

On the other hand, as described above, in the laminated piezoelectric element 56 in which the piezoelectric film 10L is folded back and laminated, the electrode is likely to be broken inside the bent portion that is folded back at an acute angle.

Therefore, by bonding the laminated piezoelectric film 10L by the bonding layer 19 having conductivity, even in a case where the electrode is broken inside the bent portion, electrical conduction can be secured by the bonding layer 19, which prevents breakage and significantly improves the reliability of the laminated piezoelectric element 56.

Here, the piezoelectric film 10L forming the laminated piezoelectric element 56 preferably has the lower protective layer 28 and the upper protective layer 30 so that the lower electrode 24 and the upper electrode 26 face each other so as to interpose the laminate therebetween as illustrated in FIG. 1.

In this case, even in a case where the bonding layer 19 having conductivity is used, the conductivity cannot be secured. Therefore, in a case where the piezoelectric film 10L has a protective layer, through-holes may be provided in the lower protective layer 28 and the upper protective layer 30 in regions where the lower electrodes 24 face each other and the upper electrodes 26 face each other in the laminated piezoelectric film 10L, and the bonding layer 19 having conductivity may be brought into contact with the lower electrode 24 and the upper electrode 26. Preferably, the through-holes formed in the lower protective layer 28 and the upper protective layer 30 are closed with a silver paste or a conductive bonding agent, and the adjacent piezoelectric film 10L is bonded thereto with the bonding layer 19 having conductivity.

In this case, the through-holes of the lower protective layer 28 and the upper protective layer 30 may be formed by removal of the protective layers through laser processing, solvent etching, mechanical polishing, or the like.

The number of through-holes of the lower protective layer 28 and the upper protective layer 30 may be formed one or more in the regions where the lower electrodes 24 face each other and the upper electrodes 26 face each other in the laminated piezoelectric film 10L, preferably outside the bent portion of the piezoelectric film 10L. Alternatively, the through-holes of the lower protective layer 28 and the upper protective layer 30 may be formed regularly or irregularly on the entire surface of the lower protective layer 28 and the upper protective layer 30.

The bonding layer 19 having conductivity is not limited, and various known bonding layers can be used.

In the above laminated piezoelectric element, the polarization direction of the laminated piezoelectric film 10 is opposite to that of the adjacent piezoelectric film 10, but the present invention is not limited thereto.

That is, in the present invention, in the laminated piezoelectric element in which the piezoelectric films 10 are laminated, the polarization directions of the piezoelectric layers 20 may be all the same as in the laminated piezoelectric element 61 illustrated in FIG. 10.

As illustrated in FIG. 10, in the laminated piezoelectric element 61 in which the polarization directions of the laminated piezoelectric films 10 are all the same, the lower electrode 24 and the upper electrode 26 face each other between the adjacent piezoelectric films 10. Therefore, in a case where the bonding layer 19 is not made sufficiently thick, the lower electrodes 24 and the upper electrodes 26 of the adjacent piezoelectric films 10 may come into contact with each other at the outer end portion of the bonding layer 19 in the surface direction, and there is a risk of a short circuit.

Therefore, as illustrated in FIG. 10, in the laminated piezoelectric element 61 in which the polarization directions of the laminated piezoelectric films 10 are all the same, the bonding layer 19 cannot be made thin, and the energy efficiency is inferior to that of the laminated piezoelectric elements illustrated in FIGS. 8 and 9.

Here, as illustrated in FIG. 9, the laminated piezoelectric element in which one sheet of piezoelectric film is folded back to laminate a plurality of piezoelectric films is considered to have two configurations.

The first configuration is such that a bent portion of the piezoelectric film formed by the folding-back extends along the longitudinal direction of the laminated piezoelectric element. That is, the first configuration is such that the bent portion of the piezoelectric film formed by the folding-back coincides with the longitudinal direction of the laminated piezoelectric element.

The second configuration is such that a bent portion of the piezoelectric film formed by the folding-back extends along the lateral direction of the laminated piezoelectric element. That is, the second configuration is such that the bent portion of the piezoelectric film formed by the folding-back coincides with the lateral direction of the laminated piezoelectric element.

In other words, the laminated piezoelectric element in which the piezoelectric film is folded back and laminated is considered to have the configuration in which the ridge formed by folding back the piezoelectric film coincides with the longitudinal direction of the laminated piezoelectric element and the configuration in which the ridge coincides with the lateral direction of the laminated piezoelectric element.

The longitudinal direction and the lateral direction of the laminated piezoelectric element are specifically the longitudinal direction and the lateral direction in the planar shape of the laminated piezoelectric element observed in the lamination direction of the piezoelectric film 10.

The planar shape of the laminated piezoelectric element observed in the lamination direction of the piezoelectric film 10 is, in other words, a shape in a case where the laminated piezoelectric element is observed in a direction perpendicular to the main surface of the piezoelectric film 10.

Specifically, in a case of producing a 20×5 cm laminated piezoelectric element by folding back one sheet of piezoelectric film to laminate five layers of the piezoelectric film, the following two configurations are considered.

Figure 11:
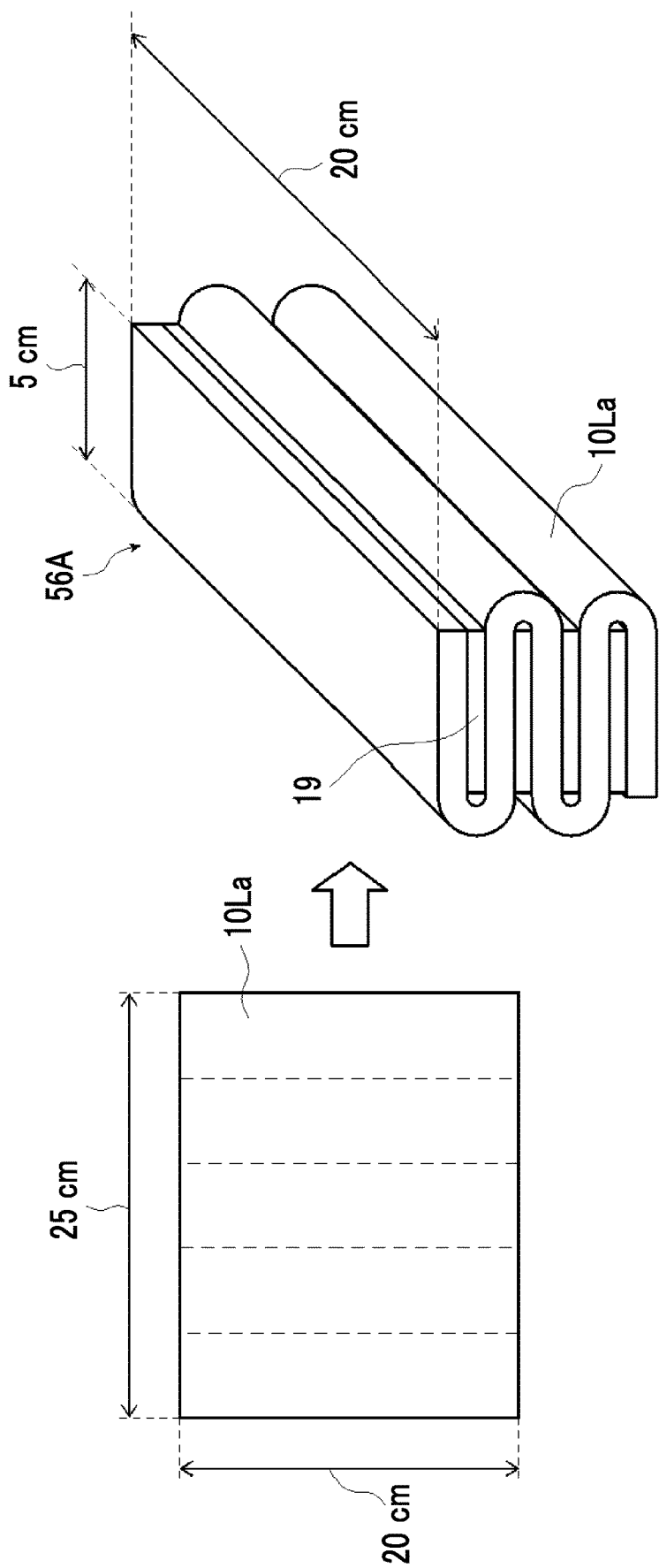
FIG. 11 is a conceptual diagram of another example of the laminated piezoelectric element of the embodiment of the present invention.

The first configuration is a laminated piezoelectric element 56A in which, as conceptually illustrated in FIG. 11, a rectangular piezoelectric film 10La of 20×25 cm is folded back four times by 5 cm in the direction of 25 cm to laminate five layers of the piezoelectric film 10La. In the laminated piezoelectric element 56A, a bent portion of the piezoelectric film 10La formed by the folding-back extends along the direction of 20 cm, which is the longitudinal direction of the laminated piezoelectric element 56A. That is, in the laminated piezoelectric element 56A, the ridge formed by folding back the piezoelectric film 10La coincides with the longitudinal direction of the laminated piezoelectric element 56A.

Figure 12:
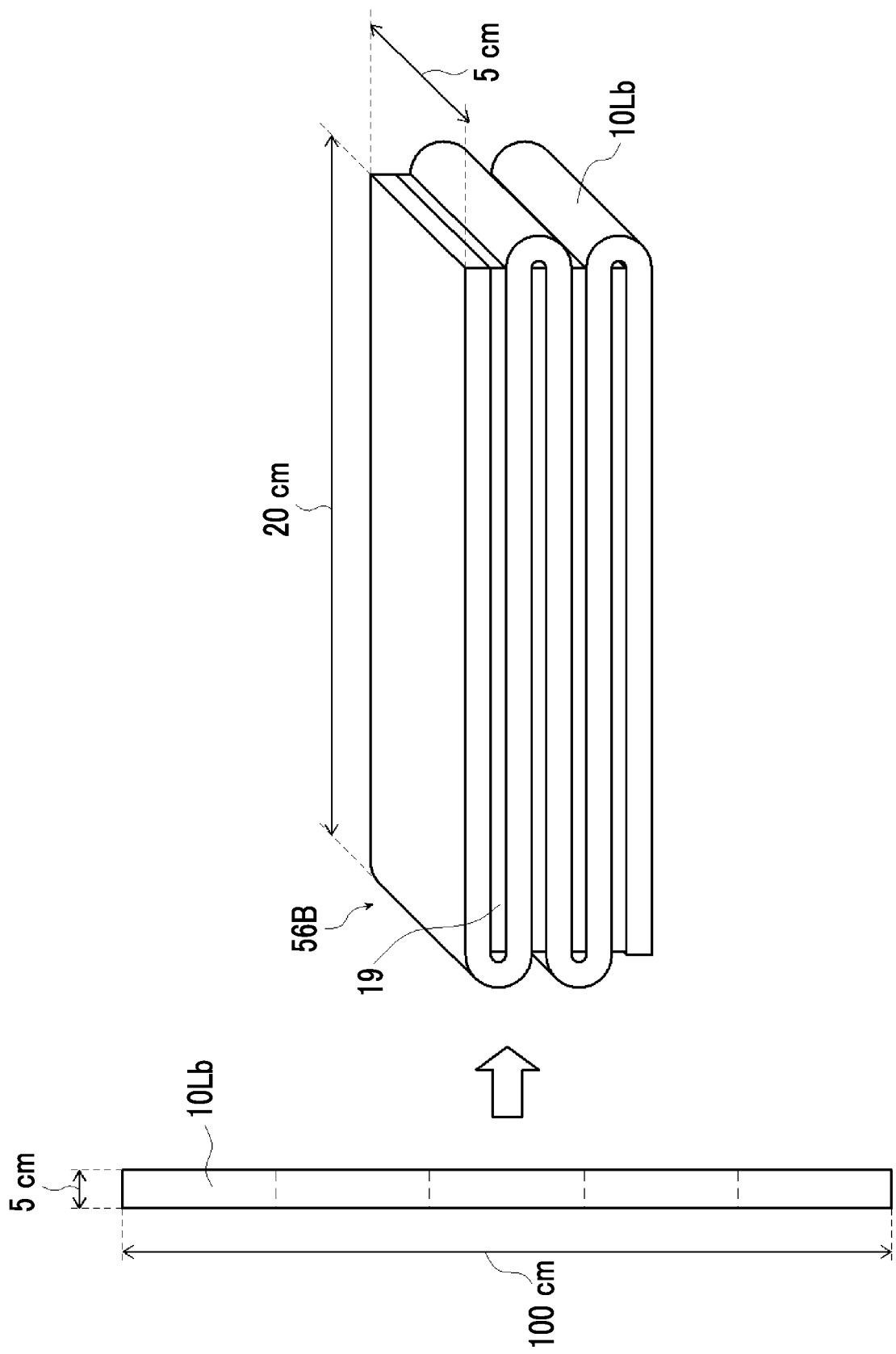
FIG. 12 is a conceptual diagram of another example of the laminated piezoelectric element of the embodiment of the present invention.

The second configuration is a laminated piezoelectric element 56B in which, as conceptually illustrated in FIG. 12, a rectangular piezoelectric film 10Lb of 100×5 cm is folded back four times by 20 cm in the direction of 100 cm to laminate five layers of the piezoelectric film 10Lb. In the laminated piezoelectric element 56B, a bent portion of the piezoelectric film 10Lb formed by the folding-back extends along the direction of 5 cm, which is the lateral direction of the laminated piezoelectric element 56B. That is, in the laminated piezoelectric element 56B, the ridge formed by folding back the piezoelectric film 10Lb coincides with the lateral direction of the laminated piezoelectric element 56B.

In the present invention, the laminated piezoelectric element in which the piezoelectric film is folded back and laminated can be suitably used in any of the configuration in which the bent portion of the piezoelectric film formed by the folding-back extends along the longitudinal direction of the laminated piezoelectric element or the configuration in which the bent portion extends along the lateral direction of the laminated piezoelectric element.

That is, each of the configuration in which the bent portion of the piezoelectric film formed by the folding-back extends along the longitudinal direction of the laminated piezoelectric element and the configuration in which the bent portion extends along the lateral direction of the laminated piezoelectric element has advantages. Therefore, which configuration to use may be appropriately set according to the usage of the laminated piezoelectric element and the like.

In addition, the laminated piezoelectric element may be provided with a lead wire which is connected to the lower electrode 24 and the upper electrode 26 and reaches the outside of the laminated piezoelectric element for connection to an external device such as a power source device. The lead wire does not necessarily have to physically protrude to the outside, which means electrical leading out from the electrode.

The lead wire can be formed by using the method described above. For example, the lead wire is provided by not providing the piezoelectric layer 20 in an end portion or an outwardly protruding region of the piezoelectric film to expose the lower electrode 24 and the upper electrode 26, and connecting the lead wire thereto. As another example, the lead wire is provided by peeling off a protective film and an electrode layer from an end portion or an outwardly protruding region of the piezoelectric film, and inserting a copper foil tape or the like between the piezoelectric layer 20 and the electrode layer. As yet another example, the lead wire is provided by providing a through-hole in the protective layer of the piezoelectric film in an end portion or an outwardly protruding region of the piezoelectric film, forming an electrical conduction member in the through-hole using a conductive paste such as a silver paste, and connecting a copper foil tape or the like to the electrical conduction member.

Furthermore, a preferable thickness of the piezoelectric layer 20 of the piezoelectric film 10 is as very small as 8 to 300 µm. Therefore, in order to prevent a short circuit, it is preferable to provide the lead wires at different positions in the surface direction of the piezoelectric film. That is, it is preferable that the lead wires are provided so as to be offset in the surface direction of the piezoelectric film.

In the laminated piezoelectric element of the embodiment of the present invention, it is preferable that the piezoelectric film 10 is provided with a protruding portion protruding from the laminated piezoelectric element, and a lead wire is connected to this protruding portion.

Figure 13:
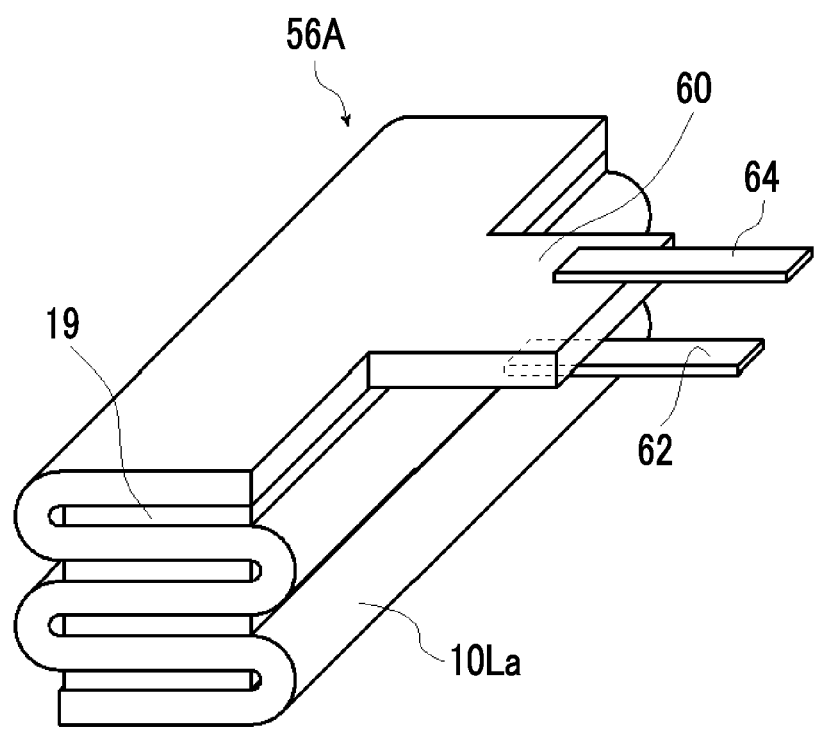
FIG. 13 is a conceptual diagram of another example of the laminated piezoelectric element of the embodiment of the present invention.

For example, in the case of the laminated piezoelectric element 56A in which the bent portion of the piezoelectric film 10La formed by the folding-back extends along the longitudinal direction, as conceptually illustrated in FIG. 13, a protruding island-shaped protruding portion 60 may be provided at one end portion in the folding-back direction, and a lead wire 62 and a lead wire 64 may be connected thereto.

Figure 14:
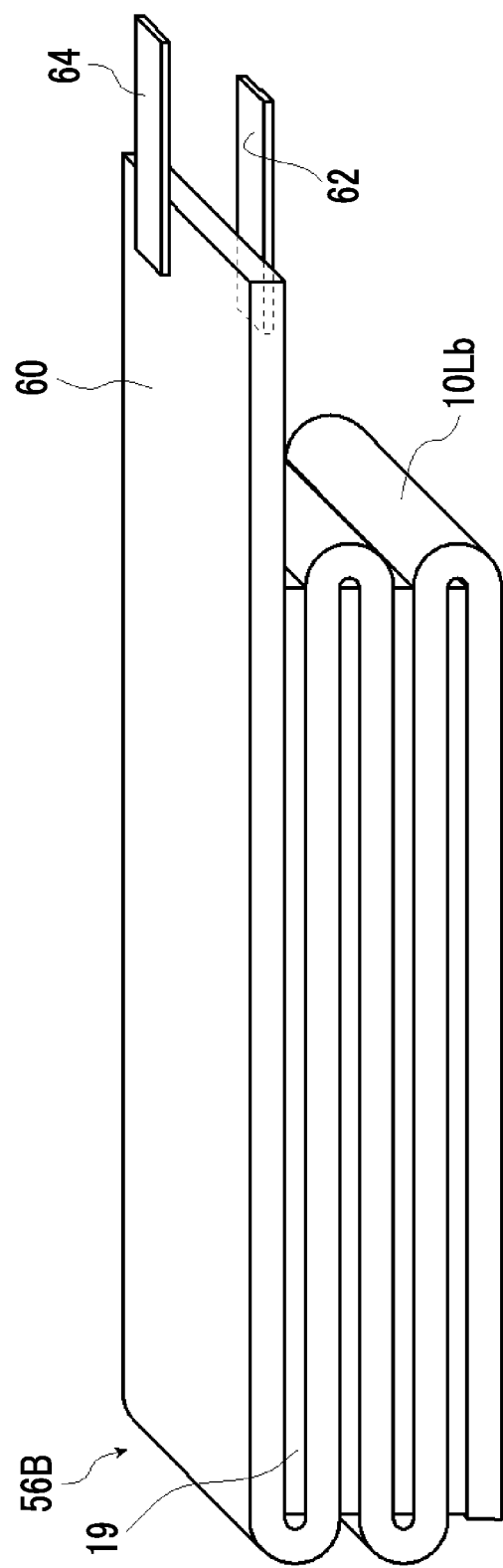
FIG. 14 is a conceptual diagram of another example of the laminated piezoelectric element of the embodiment of the present invention.

In addition, in the case of the laminated piezoelectric element 56B in which the bent portion of the piezoelectric film 10Lb formed by the folding-back extends along the lateral direction, as conceptually illustrated in FIG. 14, one end portion in the folding-back direction may be extended to form the protruding portion 60, and the lead wire 62 and the lead wire 64 may be connected to the protruding portion.

Figure 15:
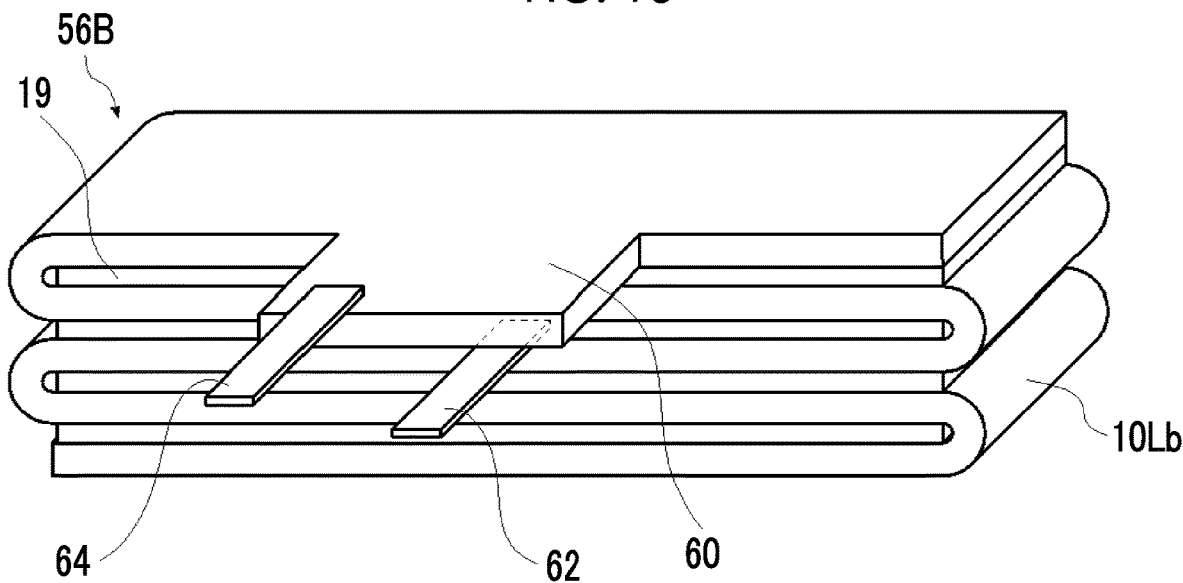
FIG. 15 is a conceptual diagram of another example of the laminated piezoelectric element of the embodiment of the present invention.

Furthermore, in the case of the laminated piezoelectric element 56B in which the bent portion of the piezoelectric film 10Lb formed by the folding-back extends along the lateral direction, as conceptually illustrated in FIG. 15, a protruding island-shaped protruding portion 60 may be provided at an end portion in a direction perpendicular to the folding-back direction, that is, an end portion in the longitudinal direction of the piezoelectric film 10Lb, and the lead wire 62 and the lead wire 64 may be connected thereto.

The protruding portion 60 may be provided in any layer of the laminated piezoelectric film, but is preferably provided in the uppermost layer or the lowermost layer in terms of piezoelectric efficiency and the like. In addition, the protruding portion may be provided in a plurality of layers such as the uppermost layer and the lowermost layer, or the uppermost layer, the intermediate layer, and the lowermost layer of the piezoelectric film, or may be provided in all the layers of the piezoelectric film. In a case where the protruding portion is provided in a plurality of layers of the piezoelectric film, the protruding portion may be provided at the end portion of the laminated piezoelectric element in the lateral direction, or may be provided at the end portion in the longitudinal direction, or the protruding portion at the end portion in the lateral direction and the protruding portion at the end portion in the longitudinal direction may be mixed.

Here, in the laminated piezoelectric element of the embodiment of the present invention, the protruding portion of the piezoelectric film protrudes from the end portion of the laminated piezoelectric element in the longitudinal direction, and the length of the protruding portion 60 in the longitudinal direction of the laminated piezoelectric element is preferably more than or equal to 10% of the length in the longitudinal direction of the laminated piezoelectric element.

In the following description, the length of the protruding portion in the longitudinal direction of the laminated piezoelectric element is also simply referred to as "the length of the protruding portion".

In a case where the protruding portion 60 is provided at the end portion of the laminated piezoelectric element in the lateral direction, the length of the protruding portion 60 in the lateral direction is preferably more than or equal to 50% of the length of the laminated piezoelectric element in the lateral direction.

This will be specifically described with reference to the conceptual diagram of the laminated piezoelectric element 56B of FIG. 16.

The laminated piezoelectric element 56B is a laminated piezoelectric element in which the bent portion of the piezoelectric film 10Lb formed by the folding-back extends along the lateral direction of the laminated piezoelectric element (see FIGS. 12 and 15). Therefore, as illustrated in FIG. 16, the longitudinal direction of the laminated piezoelectric element 56B is a direction perpendicular to the folding-back direction of the piezoelectric film 10La. That is, the longitudinal direction of the laminated piezoelectric element 56B coincides with the longitudinal direction of the piezoelectric film 10Lb.

Figure 16:
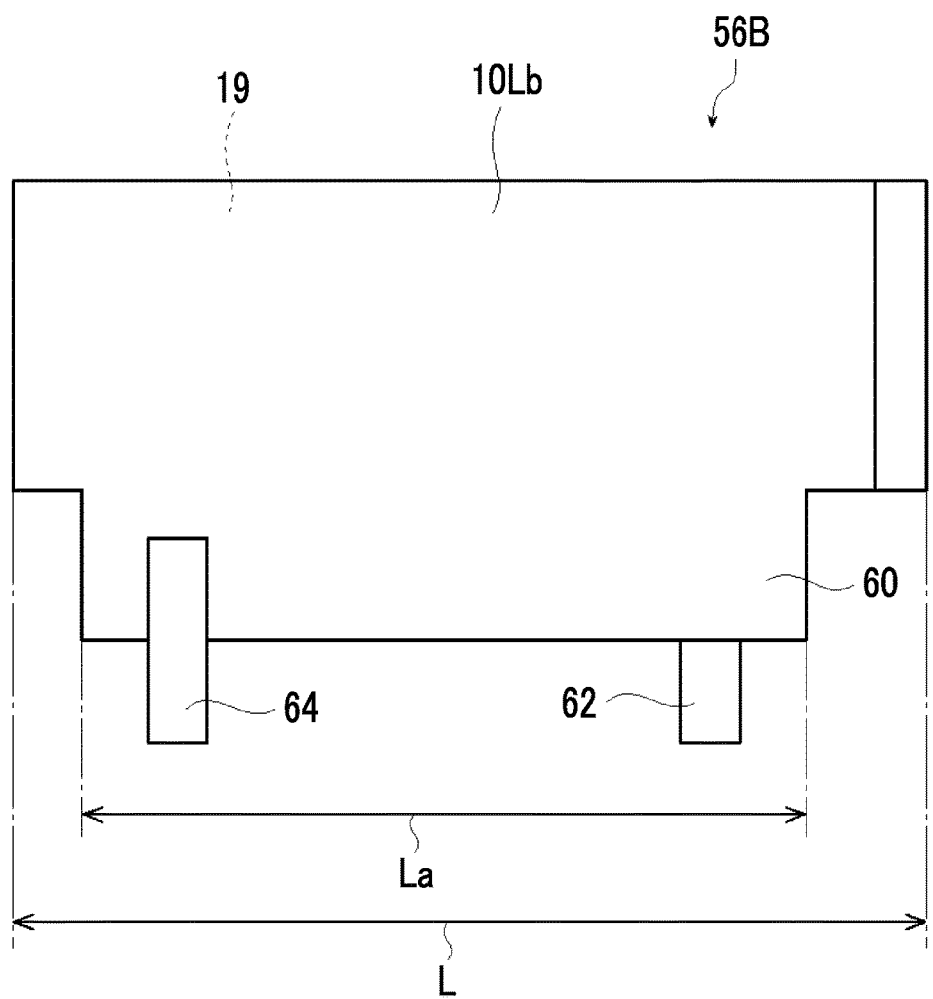
FIG. 16 is a conceptual diagram for describing a protruding portion in the laminated piezoelectric element of the embodiment of the present invention.

As illustrated in FIG. 16, the length of the laminated piezoelectric element 56B in the longitudinal direction is indicated as L. In the present invention, it is preferable that the protruding portion 60 has a length La of more than or equal to 10% of the length L, that is, satisfies "$La \geq L/10$".

Accordingly, the current density in a path through which the driving current flows from the lead wire to the laminated piezoelectric element can be reduced, so that a voltage drop can be reduced and the piezoelectric properties can be improved. For example, the above-mentioned electroacoustic transducer can improve the sound pressure.

The length La of the protruding portion 60 is more preferably more than or equal to 50%, even more preferably more than or equal to 70%, and particularly preferably more than or equal to 90% of the length L of the laminated piezoelectric element in the longitudinal direction, and is most preferably more than or equal to the length of the planar shape of the laminated piezoelectric element 56B in the longitudinal direction.

Therefore, in the case of the laminated piezoelectric element 56A illustrated in FIGS. 11 and 13 in which the bent portion of the piezoelectric film 10La formed by the folding-back extends along the longitudinal direction, as in the laminated piezoelectric element 56B illustrated in FIG. 14, it is preferable that one end portion in the folding-back direction is extended to form the protruding portion and the lead wire 62 and the lead wire 64 are connected to the protruding portion. In this case, the length La of the protruding portion coincides with the length L of the laminated piezoelectric element in the longitudinal direction. That is, in this case, the protruding portion covers the entire area of the laminated piezoelectric element in the longitudinal direction.

While the piezoelectric film, the laminated piezoelectric element, and the electroacoustic transducer of the embodiment of the present invention have been described in detail, the present invention is not limited to the examples described above, and various improvements or modifications may be naturally performed within a range not deviating from the gist of the present invention.

EXAMPLES

Hereinafter, the present invention will be described in more detail with reference to specific examples of the present invention.

Example 1

A piezoelectric film as illustrated in FIG. 2 was produced by the method illustrated in FIGS. 2 to 6 described above.

First, a matrix material was dissolved in methyl ethyl ketone (MEK) at the following compositional ratio. Thereafter, PZT particles were added to this solution at the following compositional ratio, and were dispersed by using a propeller mixer (rotation speed 2000 rpm), and thus a coating material for forming a piezoelectric layer was prepared.

PZT Particles 1000 parts by mass
Matrix material 100 parts by mass
MEK 600 parts by mass In addition, as the PZT particles, PZT particles obtained by sintering commercially available PZT raw material powder at 1000° C. to 1200° C. and thereafter crushing and classifying the sintered powder so as to have an average particle diameter of 3.5 μm were used.

As the matrix material, cyanoethylated PVA (CR-V, manufactured by Shin-Etsu Chemical Co., Ltd.) and cyanoethylated pullulan (CR-S, manufactured by Shin-Etsu Chemical Co., Ltd.) were used. The quantitative ratios of the two in the matrix material were set to 40 mass % for cyanoethylated PVA and 60 mass % for cyanoethylated pullulan.

On the other hand, a sheet-like material in which a copper thin film having a thickness of 0.1 μm was vacuum vapor deposited on a long PET film having a width of 23 cm and a thickness of 4 μm as illustrated in FIG. 2 was prepared. That is, in this example, an upper electrode and a lower electrode are copper vapor deposition thin films having a thickness of 0.1 μm, and an upper protective layer and a lower protective layer are PET films having a thickness of 4 μm.

In order to obtain good handleability during the process, as the PET film, a film with a separator (temporary support PET) having a thickness of 50 μm attached thereto was used, and the separator of each protective layer was removed after the thermal compression bonding of thin film electrodes and the protective layers.

The coating material for forming the piezoelectric layer prepared as described above was applied onto the lower electrode (copper vapor deposition thin film) of the sheet-like material by using a slide coater. The coating material was applied such that the film thickness of the coating film after being dried was 40 μm.

Next, a material in which the coating material was applied onto the sheet-like material was heated and dried in an oven at 120° C. such that MEK was evaporated. Accordingly, as illustrated in FIG. 3, a laminate was produced in which the lower electrode made of copper was provided on the lower protective layer made of PET and the piezoelectric layer having a thickness of 40 μm was formed thereon.

The piezoelectric layer of the laminate was subjected to polarization processing in a thickness direction by corona poling illustrated in FIGS. 4 and 5 described above. Furthermore, the polarization processing was performed by setting the temperature of the piezoelectric layer to 100° C., and applying a direct-current voltage of 6 kV between the lower electrode and a corona electrode so as to cause corona discharge to occur.

On the laminate subjected to the polarization processing, the same sheet-like material obtained by vacuum vapor depositing a copper thin film on a PET film was laminated as illustrated in FIG. 6.

Next, the laminate of the laminate and the sheet-like material was subjected to thermal compression bonding at 120° C. using a laminator device to adhere the piezoelectric layer to the upper electrode and the lower electrode, whereby the piezoelectric layer was interposed between the upper electrode and the lower electrode and the laminate was interposed between the upper protective layer and the lower protective layer.

Accordingly, a piezoelectric film as illustrated in FIG. 1 was produced.

For the produced piezoelectric film, a strip-shaped test piece of 1×4 cm was produced, and dynamic viscoelasticity measurement was performed to measure the loss tangent (tan δ) at a frequency of 1 Hz.

The measurement was performed using a dynamic viscoelasticity measuring machine (DMS6100 viscoelasticity spectrometer manufactured by SII NanoTechnology Inc.).

The measurement conditions were set such that the measurement temperature range was −50° C. to 170° C. and the temperature rising rate was 2° C./min (in a nitrogen atmosphere). The measurement frequencies were set to 0.1 Hz, 0.2 Hz, 0.5 Hz, 1 Hz, 2 Hz, 5 Hz, 10 Hz, and 20 Hz. The measurement mode was set to a tensile measurement. Furthermore, the chuck-to-chuck distance was set to 20 mm.

As a result, in the piezoelectric film, the loss tangent at a frequency of 1 Hz had a maximal value (maximum value) of 0.34 at 100° C. in a temperature range of higher than 50° C. and lower than or equal to 150° C.

The loss tangent of the piezoelectric film at a frequency of 1 Hz and 50° C. was 0.1.

Comparative Example 1

In a coating material for forming a piezoelectric layer, the quantitative ratios in a matrix material were set to 70 mass % for cyanoethylated PVA and 30 mass % for cyanoethylated pullulan. A piezoelectric film was produced in the same manner as in Example 1 except that this coating material was used.

For the produced piezoelectric film, the loss tangent at a frequency of 1 Hz was measured in the same manner as in Example 1.

As a result, in the piezoelectric film, the loss tangent at a frequency of 1 Hz had a maximal value (maximum value) of 0.09 at 80° C. in a temperature range of higher than 50° C. and lower than or equal to 150° C. The loss tangent of the piezoelectric film at a frequency of 1 Hz and 50° C. was 0.2.

Comparative Example 2

In a coating material for forming a piezoelectric layer, a matrix material was set to 100 mass % of cyanoethylated pullulan. A piezoelectric film was produced in the same manner as in Example 1 except that this coating material was used.

For the produced piezoelectric film, the loss tangent at a frequency of 1 Hz was measured in the same manner as in Example 1.

As a result, in the piezoelectric film, the loss tangent at a frequency of 1 Hz had a maximal value (maximum value) of 0.45 at 120° C. in a temperature range of higher than 50° C. and lower than or equal to 150° C. The loss tangent of the piezoelectric film at a frequency of 1 Hz and 50° C. was 0.06.

The flexibility of the produced piezoelectric film was evaluated as follows.

Using an iron round bar, a bending test of folding back the piezoelectric film by 180° so that the center portion of the vibration plate had a radius of curvature of 5 cm was performed 10,000 times. The flexibility was evaluated in two temperature environments, a high temperature (100° C.) and room temperature (25° C.).

A case where peeling had not occurred from any interface even after performing the bending test 10,000 times was evaluated as A.

A case where peeling had occurred from any interface while performing the bending test 1,000 to 9,999 times was evaluated as B.

A case where peeling had occurred from any interface while performing the bending test up to 999 times was evaluated as C.

The results are shown in the table below.

TABLE 1

| | Loss tangent | | | Evaluation of flexibility | |
|---|---|---|---|---|---|
| | Maximal at 1 Hz in higher than 50° C. and lower than or equal to 150° C. | | | | |
| | Temperature [° C.] | Maximal value | 1 Hz, 50° C. | High temperature | Room temperature |
| Example 1 | 100 | 0.34 | 0.1 | A | B |
| Comparative Example 1 | 80 | 0.09 | 0.2 | C | A |
| Comparative Example 2 | 120 | 0.45 | 0.06 | A | C |

As shown in Table 1, the piezoelectric film of the embodiment of the present invention in which the loss tangent at a frequency of 1 Hz has a maximal value of greater than or equal to 0.1 in a temperature range of higher than 50° C. and lower than or equal to 150° C., and a value of greater than or equal to 0.08 at 50° C. has excellent flexibility in a high temperature range and also has good flexibility in a room temperature range.

Contrary to this, the piezoelectric film of Comparative Example 1 in which the loss tangent at a frequency of 1 Hz has a value of greater than or equal to 0.08 at 50° C. a maximal value in a temperature range of higher than 50° C. and lower than or equal to 150° C. but the maximal value is less than 0.1 has excellent flexibility in a room temperature range, but lower flexibility than that of the present invention in a high temperature range.

Furthermore, the piezoelectric film of Comparative Example 2 in which the loss tangent at a frequency of 1 Hz has a maximal value of greater than or equal to 0.1 in a temperature range of higher than 50° C. and lower than or equal to 150° C. but has a value of less than 0.08 at 50° C. has excellent flexibility in a high temperature range, but lower flexibility in a room temperature range.

From the above results, the effect of the present invention is obvious.

Suitable use for various usages such as audio equipment including speakers and microphones and pressure-sensitive sensors can be achieved.

EXPLANATION OF REFERENCES 10, 10L, 10La, 10Lb: piezoelectric film
10a, 10c: sheet-like material
10b: laminate
12: vibration plate
14, 56, 56A, 56B, 61: laminated piezoelectric element
16, 19: bonding layer
20: piezoelectric layer
24: lower electrode
26: upper electrode
28: lower protective layer
30: upper protective layer
34: matrix
36: piezoelectric particles
40: corona electrode
42: direct-current power source
43: case
45: piezoelectric speaker
46: viscoelastic support
48: frame
50: electroacoustic transducer
58: core rod
60: protruding portion
62, 64: lead wire
PS: power source

What is claimed is:

1. A piezoelectric film comprising:
a polymer-based piezoelectric composite material in which piezoelectric particles are dispersed in a matrix including a polymer material; and
electrode layers formed on both surfaces of the polymer-based piezoelectric composite material,
wherein a loss tangent at a frequency of 1 Hz according to dynamic viscoelasticity measurement has a maximal value of greater than or equal to 0.1 existing in a temperature range of higher than 50° C. and lower than or equal to 150° C., and has a value of greater than or equal to 0.08 at 50° C.

2. The piezoelectric film according to claim 1, further comprising:
a protective layer provided on a surface of the electrode layer.

3. The piezoelectric film according to claim 1,
wherein the piezoelectric film is polarized in a thickness direction.

4. The piezoelectric film according to claim 1,
wherein the piezoelectric film has no in-plane anisotropy in piezoelectric properties.

5. The piezoelectric film according to claim 1, further comprising:
a lead wire for connecting the electrode layer to an external power source.

6. A laminated piezoelectric element formed by laminating a plurality of layers of the piezoelectric films according to claim 1.

7. The laminated piezoelectric element according to claim 6,
wherein the piezoelectric films are polarized in a thickness direction, and
polarization directions of the piezoelectric films adjacent to each other are opposite to each other.

8. The laminated piezoelectric element according to claim 6,
wherein the laminated piezoelectric element is formed by laminating a plurality of layers of the piezoelectric film by folding back the piezoelectric film one or more times.

9. The laminated piezoelectric element according to claim 6, comprising:
a bonding layer which bonds the piezoelectric films adjacent to each other.

10. An electroacoustic transducer comprising:
a vibration plate; and
the laminated piezoelectric element according to claim 6.

11. The electroacoustic transducer according to claim 10,
wherein a product of a thickness of the laminated piezoelectric element and a storage elastic modulus at a frequency of 1 Hz and 25° C. according to dynamic viscoelasticity measurement is 0.1 to 3 times a product of a thickness of the vibration plate and a Young's modulus.

12. The electroacoustic transducer according to claim 10, wherein a product of a thickness of the laminated piezoelectric element and a storage elastic modulus at a frequency of 1 kHz and 25° C. in a master curve obtained from dynamic viscoelasticity measurement is 0.3 to 10 times a product of a thickness of the vibration plate and a Young's modulus.

13. The electroacoustic transducer according to claim 10, further comprising:
   a bonding layer which bonds the vibration plate to the laminated piezoelectric element.

14. An electroacoustic transducer comprising:
   a vibration plate; and
   the piezoelectric film according to claim 1.

15. The electroacoustic transducer according to claim 14, wherein a product of a thickness of the piezoelectric film and a storage elastic modulus at a frequency of 1 Hz and 25° C. according to dynamic viscoelasticity measurement is 0.1 to 3 times a product of a thickness of the vibration plate and a Young's modulus.

16. The electroacoustic transducer according to claim 14, wherein a product of a thickness of the piezoelectric film and a storage elastic modulus at a frequency of 1 kHz and 25° C. in a master curve obtained from dynamic viscoelasticity measurement is 0.3 to 10 times a product of a thickness of the vibration plate and a Young's modulus.

17. The electroacoustic transducer according to claim 14, further comprising:
   a bonding layer which bonds the vibration plate to the piezoelectric film.

* * * * *